US012349493B2

(12) United States Patent
Lin et al.

(10) Patent No.: US 12,349,493 B2
(45) Date of Patent: Jul. 1, 2025

(54) SEMICONDUCTOR STRUCTURE AND MANUFACTURING METHOD OF THE SAME

(71) Applicant: TAIWAN SEMICONDUCTOR MANUFACTURING COMPANY LTD., Hsinchu (TW)

(72) Inventors: Ming-Shiang Lin, Hsinchu (TW); Tzung-Yi Tsai, Taoyuan (TW); Wan-Lin Chiang, Hsinchu (TW); Hong-Ping Luo, Hsinchu (TW); Kuo-Yu Wu, Hsinchu County (TW); Tse-Hua Lu, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 653 days.

(21) Appl. No.: 17/378,365

(22) Filed: Jul. 16, 2021

(65) Prior Publication Data

US 2023/0017723 A1    Jan. 19, 2023

(51) Int. Cl.
  *H01L 27/14*    (2006.01)
  *H10F 39/00*    (2025.01)
  *H10F 39/12*    (2025.01)

(52) U.S. Cl.
  CPC ......... *H10F 39/807* (2025.01); *H10F 39/024* (2025.01); *H10F 39/028* (2025.01); *H10F 39/199* (2025.01)

(58) Field of Classification Search
  CPC ............. H01L 27/1463; H01L 27/1464; H01L 27/14685; H01L 27/14698; H10F 39/807; H10F 39/199; H10F 39/028; H10F 39/024
  See application file for complete search history.

(56) References Cited

U.S. PATENT DOCUMENTS

| | | | | |
|---|---|---|---|---|
| 11,204,415 B2* | 12/2021 | Jin | ................... | H01L 27/14625 |
| 11,398,513 B2* | 7/2022 | Jin | ................... | H01L 27/14636 |
| 11,552,116 B2* | 1/2023 | Dalleau | ............. | H01L 27/14612 |
| 11,762,073 B2* | 9/2023 | Jin | .......................... | G01S 7/499 |
| | | | | 356/5.03 |
| 2004/0099886 A1* | 5/2004 | Rhodes | ............. | H01L 27/14689 |
| | | | | 257/222 |
| 2007/0210395 A1* | 9/2007 | Maruyama | ........ | H01L 27/14609 |
| | | | | 257/431 |
| 2011/0204467 A1* | 8/2011 | Ohchi | ................. | H01L 27/1463 |
| | | | | 438/57 |

(Continued)

FOREIGN PATENT DOCUMENTS

WO    WO-2023210203 A1 * 11/2023

*Primary Examiner* — Mounir S Amer
*Assistant Examiner* — Alexander Belousov
(74) *Attorney, Agent, or Firm* — WPAT LAW; Anthony King

(57) ABSTRACT

A semiconductor device, a back-side deep trench isolation (BDTI) structure of a semiconductor device, and method of manufacturing a semiconductor structure are provided. The semiconductor device, comprising: a pixel region disposed within a substrate and comprising an image sensing element configured to convert electromagnetic radiation into an electrical signal; and one or more BDTI structures extending from a first-side of the substrate to positions within the substrate; wherein the one or more of BDTI structures comprise one or more ferroelectric materials.

20 Claims, 18 Drawing Sheets

(56) References Cited

U.S. PATENT DOCUMENTS

| | | | |
|---|---|---|---|
| 2017/0103988 A1* | 4/2017 | Nishida | H01L 29/6684 |
| 2019/0378834 A1* | 12/2019 | Penumatcha | H01L 29/78681 |
| 2020/0103511 A1* | 4/2020 | Jin | G01S 7/499 |
| 2021/0074749 A1* | 3/2021 | Dalleau | H04N 25/77 |
| 2021/0091135 A1* | 3/2021 | Yokogawa | H01L 27/14612 |
| 2021/0134867 A1* | 5/2021 | Jin | H01L 27/14627 |
| 2021/0399135 A1* | 12/2021 | Polakowski | H10B 53/30 |
| 2022/0082673 A1* | 3/2022 | Jin | G02B 5/3058 |
| 2022/0199669 A1* | 6/2022 | Lee | H01L 27/14625 |
| 2022/0310471 A1* | 9/2022 | Chiu | H01L 25/16 |
| 2022/0352220 A1* | 11/2022 | Zang | H01L 27/14607 |
| 2022/0399393 A1* | 12/2022 | Kang | H01L 27/14607 |
| 2023/0017723 A1* | 1/2023 | Lin | H01L 27/1463 |

\* cited by examiner

SEMICONDUCTOR STRUCTURE AND MANUFACTURING METHOD OF THE SAME

BACKGROUND

Digital cameras and optical imaging devices employ image sensors. Image sensors convert optical images to digital data that may be represented as digital images. An image sensor typically includes an array of pixel sensors, which are unit devices for the conversion of an optical image into electrical signals. Pixel sensors often manifest as charge-coupled devices (CCDs) or complementary metal oxide semiconductor (CMOS) devices. However, CMOS pixel sensors have recently received more attention. Relative to CCD pixel sensors, CMOS pixel sensors provide lower power consumption, smaller size, and faster data processing. Further, CMOS pixel sensors provide a direct digital output of data, and generally have a lower manufacturing cost compared with CCD pixel sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
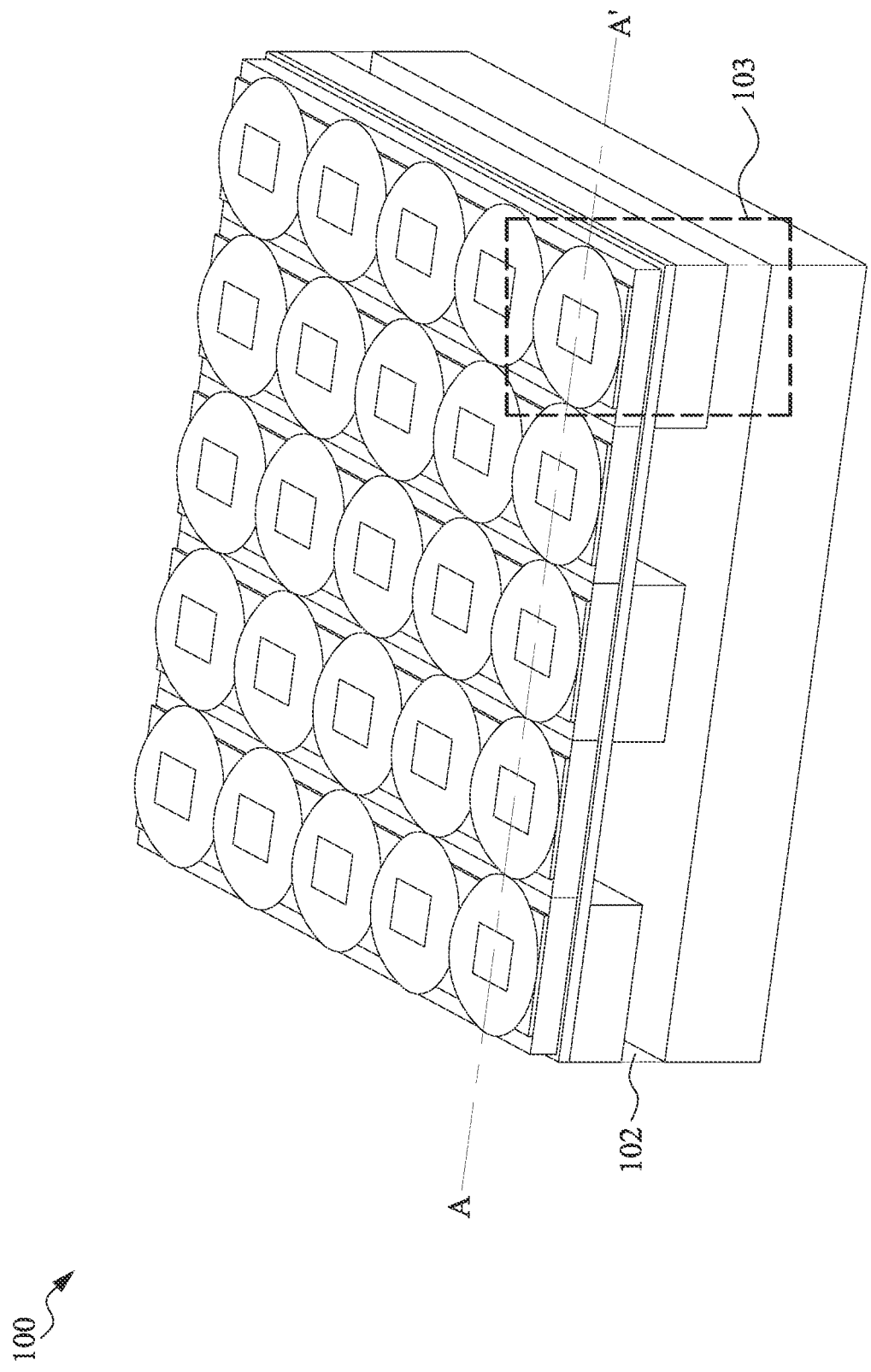
FIG. 1 is a perspective view of a CMOS image sensor having a plurality of pixel regions according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence, order, or importance unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally means within a value or range (e.g., within 10%, 5%, 1%, or 0.5% of a given value or range) that can be contemplated by people having ordinary skill in the art. Alternatively, the term "substantially," "approximately" or "about" means within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another end point or between two endpoints. All ranges disclosed herein are inclusive of the endpoints, unless specified otherwise.

CMOS pixel sensors include an array of active pixel regions, which include photodiodes and transistors that absorb incident radiation projected toward the sensors and convert the incident radiation into electrical signals. The CMOS pixel sensors further include a plurality of BDTI structures that are arranged between adjacent pixel regions and provide pixel regions with electrical isolation. In some embodiments, the BDTI structures are formed by first etching the back-side surface of a substrate to form deep trenches within the substrate and then filling the deep trenches with an insulating material with a dielectric constant equal to or greater than 3.9 (hereinafter referred to as the "high-k dielectric").

In some applications, one or more functional layers may be disposed over the front-side surface of the substrate prior to the formation of BDTI structures. The functional layer(s) may be used to enhance the performance of the semiconductor device, but also includes one or more potential contaminants for the substrate. For example, during the etch operations for forming the BDTI structures, the contaminants may be dissociated from the functional layer(s) and diffuse into the substrate through sidewalls of the deep trenches as the deep trenches are being formed. The contaminants can degrade performance CMOS pixel sensors by introducing interface defects near an edge of the BDTI structures. The interface defects can lead to an increase in dark current and/or white pixel number. The increase in dark current causes charges to accumulate even when light is not irradiating on the CMOS pixel sensors, thereby becoming a major source of noise that can degrade image quality of digital imaging devices.

As the sizes of transistors and pixel regions shrink with each technology node, due to process limitations, the critical dimension of a BDTI structure cannot be reduced accordingly. As a result, the interface defects induced during etching operations for forming BDTI structures are getting proximate to the photodiodes so that the interfacial dipole moments present at the interface between the high-k dielectric and the substrate become insufficient to trap the inference defects. In this regard, there is a need in the art to provide a CMOS pixel sensor having a BDTI structure with enhanced dipole moments so as to decrease the dark current and/or white pixel number under the same BDTI etching operation or critical dimension.

In some embodiments, the present disclosure provides a CMOS image sensor including a plurality of BDTI structures with a ferroelectric layer, which is configured to reduce dark current and white pixel number, and associated formation operations. The CMOS image sensor has a plurality of pixel regions disposed within the substrate of the CMOS image sensor. In some embodiments, the ferroelectric layer may have a dielectric constant of equal to or greater than 3.9. The plurality of pixel regions can be electrically isolated by the plurality of BDTI structures.

In some embodiments, to improve the dielectric properties the BDTI structures, the plurality of BDTI structures may further include one or more high-k dielectrics disposed over the ferroelectric layer. The ferroelectric layer vertically and laterally separate the one or more high-k dielectrics from the substrate. Each of the plurality of pixel regions has an image sensing element configured to convert radiation into an electric signal. The plurality of BDTI structures may extend from the back-side of the substrate into positions within the substrate. A ferroelectric layer is included within the BDTI structures and separates the high-k dielectric from substrate. The presence of the ferroelectric layer help to enhance the dipole moments present within the BDTI structures and reduce the interaction between the image sensing element and the interface defects near the edges of the BDTI structures, and thereby effectively reduces dark current and improves white pixel number performance without any adverse side-effect.

In the present disclosure, the ferroelectric layer may include one or more materials with an orthorhombic crystal structure. In some embodiments, the ferroelectric layer may substantially consist of one or more materials with an orthorhombic crystal structure. The ferroelectric layer may consist of one or more materials with an orthorhombic crystal structure. In further embodiments, the materials suitable for the ferroelectric layer may be a doped high-k dielectric, such as a high-k dielectric doped with Si or metal elements (e.g. Zr, Al, La, Y, Gd, Sr). Examples of the doped high-k dielectric include Si-doped hafnium oxide, Si-doped lead zirconate titanate (PZT), Si-doped lanthanum oxide, Si-doped aluminium oxide, Si-doped zirconium oxide, Si-doped titanium oxide, Si-doped tantalum oxide, Si-doped yttrium oxide, Si-doped strontium titanate (STO), Si-doped barium titanate (BTO), Si-doped barium zirconate, Si-doped hafnium zirconate, Si-doped hafnium-lanthanum oxide, Si-doped hafnium-tantalum oxide, Si-doped hafnium-titanium oxide, Si-doped barium strontium titanate (BST), Zr-doped hafnium oxide, Zr-doped lanthanum oxide, Zr-doped aluminium oxide, Zr-doped titanium oxide, Zr-doped tantalum oxide, Zr-doped yttrium oxide, Zr-doped STO, Zr-doped BTO, Zr-doped hafnium-lanthanum oxide, Zr-doped hafnium-silicon oxide, Zr-doped lanthanum-silicon oxide, Zr-doped aluminium-silicon oxide, Zr-doped hafnium-tantalum oxide, Zr-doped hafnium-titanium oxide, Zr-doped BST, Al-doped hafnium oxide, Al-doped PZT, Al-doped lanthanum oxide, Al-doped zirconium oxide, Al-doped titanium oxide, Al-doped tantalum oxide, Al-doped yttrium oxide, Al-doped STO, Al-doped BTO, Al-doped barium zirconate, Al-doped hafnium zirconate, Al-doped hafnium-lanthanum oxide, Al-doped hafnium-silicon oxide, Al-doped lanthanum-silicon oxide, Al-doped hafnium-tantalum oxide, Al-doped hafnium-titanium oxide, Al-doped BST, La-doped hafnium oxide, La-doped PZT, La-doped aluminium oxide, La-doped zirconium oxide, La-doped titanium oxide, La-doped tantalum oxide, La-doped yttrium oxide, La-doped STO, La-doped BTO, La-doped barium zirconate, La-doped hafnium zirconate, La-doped hafnium-silicon oxide, La-doped aluminium-silicon oxide, La-doped hafnium-tantalum oxide, La-doped hafnium-titanium oxide, La-doped BST, Y-doped hafnium oxide, Y-doped PZT, Y-doped lanthanum oxide, Y-doped aluminium oxide, Y-doped zirconium oxide, Y-doped titanium oxide, Y-doped tantalum oxide, Y-doped STO, Y-doped BTO, Y-doped barium zirconate, Y-doped hafnium zirconate, Y-doped hafnium-lanthanum oxide, Y-doped hafnium-silicon oxide, Y-doped lanthanum-silicon oxide, Y-doped aluminium-silicon oxide, Y-doped hafnium-tantalum oxide, Y-doped hafnium-titanium oxide, Y-doped BST, Gd-doped hafnium oxide, Gd-doped PZT, Gd-doped lanthanum oxide, Gd-doped aluminium oxide, Gd-doped zirconium oxide, Gd-doped titanium oxide, Gd-doped tantalum oxide, Gd-doped yttrium oxide, Gd-doped STO, Gd-doped BTO, Gd-doped barium zirconate, Gd-doped hafnium zirconate, Gd-doped hafnium-lanthanum oxide, Gd-doped hafnium-silicon oxide, Gd-doped lanthanum-silicon oxide, Gd-doped aluminium-silicon oxide, Gd-doped hafnium-tantalum oxide, Gd-doped hafnium-titanium oxide, Gd-doped BST, Sr-doped hafnium oxide, Sr-doped PZT, Sr-doped lanthanum oxide, Sr-doped aluminium oxide, Sr-doped zirconium oxide, Sr-doped titanium oxide, Sr-doped tantalum oxide, Sr-doped yttrium oxide, Sr-doped BTO, Sr-doped barium zirconate, Sr-doped hafnium zirconate, Sr-doped hafnium-lanthanum oxide, Sr-doped hafnium-silicon oxide, Sr-doped lanthanum-silicon oxide, Sr-doped aluminium-silicon oxide, Sr-doped hafnium-tantalum oxide, Sr-doped hafnium-titanium oxide, and Sr-doped BST. The dipole moments induced by the anions atoms at a stable state contribute to the ferroelectric effect due to the non-centrosymmetric $Pca2_1$ structure of an orthorhombic crystal.

Without wishing to be bound by theory, it is found that the normalized polarization of the ferroelectric layer according to the present disclosure is equal to or greater than 10 $\mu Coul/cm^2$ at a thickness equal to or less than 100 Å, for example but being not limited to 10, 15, 20, 25, 30, 35, 40, 45, 50, 55, 60, 65, 70, 75, 80, 85, 90, 95 or 100 $\mu Coul/cm^2$. In contrast to the ferroelectric layer according to the present disclosure, for a high-k dielectric/substrate heterostructure, the dipole moments are induced at the interface due to the difference in electronegativity between the atoms of the high-k dielectric and those of the substrate. For example, if Si is used as the substrate, and hafnium oxide is used as the high-k dielectric, the electronegativity of Hf is 1.32, and the electronegativity of Si is 1.98. Thus, the difference in electronegativity between Hf and Si lead to an electric dipole moment to be present at the interface between hafnium oxide and the Si substrate. In addition, since an Hf-based high-k dielectric/Si heterostructure generally contains a thin $SiO_2$ layer at the interface, the polarization of interfacial O atoms partially screens the dipole formed by a Hf—O—Si bridge and minimizes the dipole effect. Hence, an Hf-based high-k dielectric/Si heterostructure generally has a normalized polarization of equal to or less than 2 $\mu Coul/cm^2$.

If the one or more high-k dielectrics are present, the ferroelectric layer vertically and laterally separate the one or more high-k dielectrics from the substrate. In some embodiments, the ferroelectric layer and the one or more high-k dielectrics are different in their ferroelectricity. The ferroelectric layer and the one or more high-k dielectrics are different in their crystal structures. In some embodiments, the one or more high-k dielectrics may be undoped dielectric(s). In the present disclosure, the term "undoped dielectric" refers to a dielectric that is substantially free of dopant or a dielectric including merely native impurities. In some cases, the total amount of the dopants/impurities in the dielectric is less than 1 atomic %, for example but being not limited to 1, 0.5, 0.1, 0.05, 0.01, 0.005 or 0.001 atomic %. In further embodiments, the ferroelectric layer is ferroelectric. The ferroelectric layer has an orthorhombic phase. The one or more high-k dielectrics are paraelectric. The one or more high-k dielectrics have an amorphous phase or a phase other than the orthorhombic structure.

Figure 2:
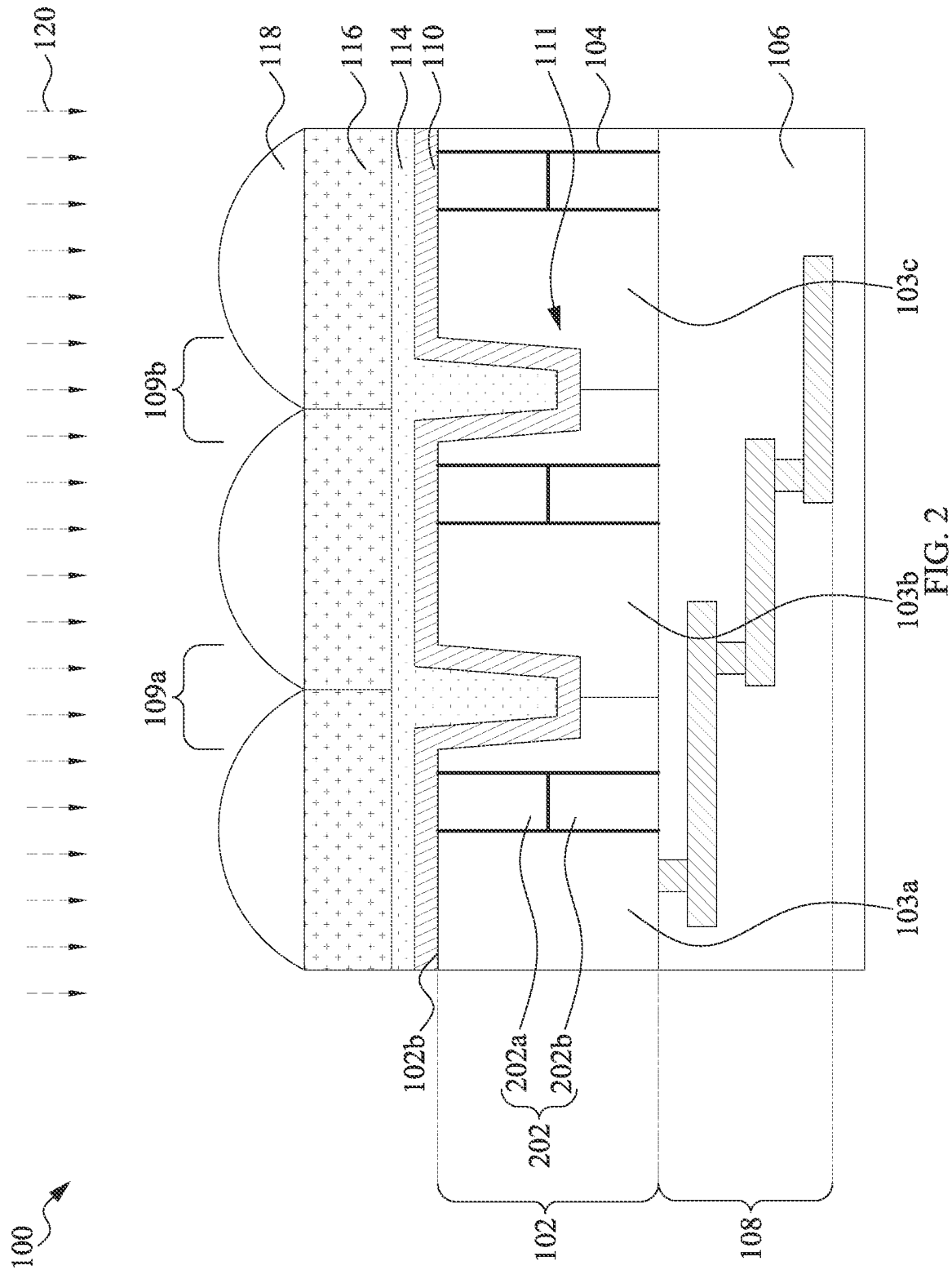
FIG. 2 illustrates a cross-sectional view alone line A-A' in FIG. 1 of the CMOS image sensor having a plurality of light sensing elements electrically isolated by a plurality of backside deep trench isolation (BDTI) structures with a ferroelectric layer according to an embodiment of the present disclosure.

FIG. 1 shows a perspective view of a CMOS image sensor 100 including a plurality of pixel regions 103 according to an embodiment of the present disclosure. In some embodiments, the plurality of pixel regions 103a may be arranged within a substrate 102 in an array including rows and/or columns. FIG. 2 illustrates a cross-sectional view alone line A-A' in FIG. 1 of the CMOS image sensor 100. The CMOS image sensor 100 includes a substrate 102 having a plurality of pixel regions 103a-103c. In some embodiments, the substrate 102 may be a semiconductor substrate. Each of the plurality of pixel regions 103a-103c includes an image sensing element 104 configured to convert incident radiation 120 (e.g., photons) into an electric signal. In some embodiments, the image sensing element 104 may include a photodiode 202. In such embodiments, the photodiode 202 may include a first region 202a within the substrate 102 having a first doping type (e.g., n-type doping) and an adjoining second region 202b within the substrate 102 having a second doping type (e.g., p-type doping) that is different than the first doping type.

The pixel regions 103a-103c are electrically isolated from each other by a plurality of BDTI structures 111 extending into the substrate 102 and including a ferroelectric layer 110 and optionally a high-k dielectric layer 114. In some embodiments, the high-k dielectric layer 114 may include one or more high-k dielectrics. In some embodiments, the BDTI structures 111 may vertically extend from a back-side of the substrate 102 to a location within the substrate 102. The back-side of the substrate 102 opposes a line stack, e.g. a back-end-of-the-line (BEOL) metallization stack, including a plurality of metal interconnect layers 108 arranged within an ILD layer 106. In various embodiments, the plurality of BDTI structures 111 may extend to a depth $d_{BDTI}$ of greater than or equal to 0.5 microns within the substrate 102.

A plurality of color filters 116 are arranged over the back-side of the substrate 102. The plurality of color filters 116 are respectively configured to transmit specific wavelengths of incident radiation 120. For example, a first color filter (e.g., a red color filter) may transmit light having wavelengths within a first range, while a second color filter may transmit light having wavelengths within a second range different than the first range. A plurality of micro-lenses 118 are arranged over the plurality of color filters 116. Respective micro-lenses 118 are aligned laterally with the color filters 116 and overlie the pixel regions 103a-103c. The micro-lenses 118 are configured to focus the incident radiation 120 (e.g., light) towards the pixel regions 103a-103c.

The photodiode 202 includes a first region 202a and an underlying second region 202b arranged within the substrate 102. The first region 202a has a first doping type and the second region 202b has a second doping type that is different than the first doping type. In some embodiments, the first region 202a includes an n-type region and the second region 202b includes a p-type region.

The plurality of BDTI structures 111 are arranged within a back-side 102b of the substrate 102 and laterally isolate the photodiodes 202. The plurality of BDTI structures 111 include the ferroelectric layer 110 and optionally the high-k dielectric layer 114 arranged within the substrate 102 and over the back-side 102b of the substrate 102.

In some embodiments, the ferroelectric layer 110 is provided at the interface between the plurality of BDTI structures 111 and the substrate 102. The ferroelectric layer 110 may be conformally disposed in the deep trenches 109a and 109b. The ferroelectric layer 110 extends along the sidewalls and bottom surfaces of the deep trenches 109a and 109b. In some embodiments, the ferroelectric layer 110 may extend over the back-side 102b of the substrate 102 between the trench 109a and the deep trench 109b. In some embodiments, the ferroelectric layer 110 may include one or more doped high-k dielectric. In some embodiments, the ferroelectric layer 110 can be formed by in-situ doping a high-k dielectric. The dopants used in this operation may include Si and/or metal elements (such as Zr, Al, La, Y, Gd, Sr), and/or other suitable materials. The high-k dielectric used in this operation may include hafnium oxide, lead zirconate titanate (PZT), lanthanum oxide, aluminium oxide, zirconium oxide, titanium oxide, tantalum oxide, yttrium oxide, strontium titanate (STO), barium titanate (BTO), barium zirconate, hafnium zirconate, hafnium-lanthanum oxide, hafnium-silicon oxide, lanthanum-silicon oxide, aluminium-silicon oxide, hafnium-tantalum oxide, hafnium-titanium oxide, barium strontium titanate (BST), and/or other suitable materials. As such, the ferroelectric layer 110 including a doped high-k dielectric reduces the dark current and/or white pixel number of the CMOS image sensor 100.

Figure 3:
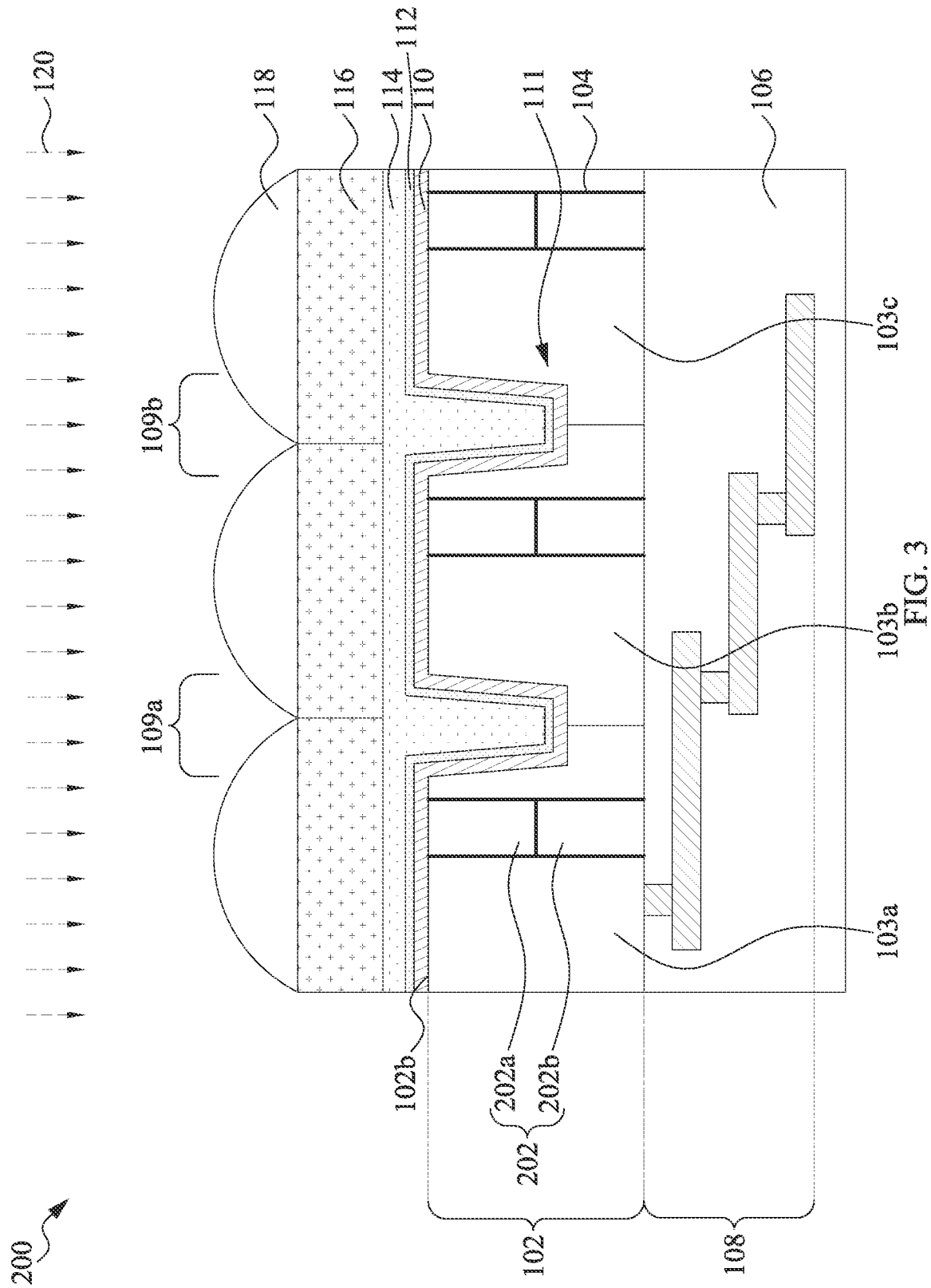
FIG. 3 illustrates a cross-sectional view alone line A-A' in FIG. 1 of the CMOS image sensor having a plurality of light sensing elements electrically isolated by a plurality of backside deep trench isolation (BDTI) structures with a ferroelectric layer according to an embodiment of the present disclosure.

FIG. 3 illustrates a cross-sectional view alone line A-A' in FIG. 1 of the CMOS image sensor 200 according to some embodiments of the present disclosure. The CMOS image sensor 200 is substantially the same as the CMOS image sensor 100 except that a cap layer 112 is present between the ferroelectric layer 112 and the high-k dielectric layer 114. The cap layer 112 may include any metals suitable for a metallization operation and their nitrides (e.g. TiN, TaN, $W_2N$, TiSiN, TaSiN) or other materials such as Pt, Au, W, or combinations thereof.

Figure 4:
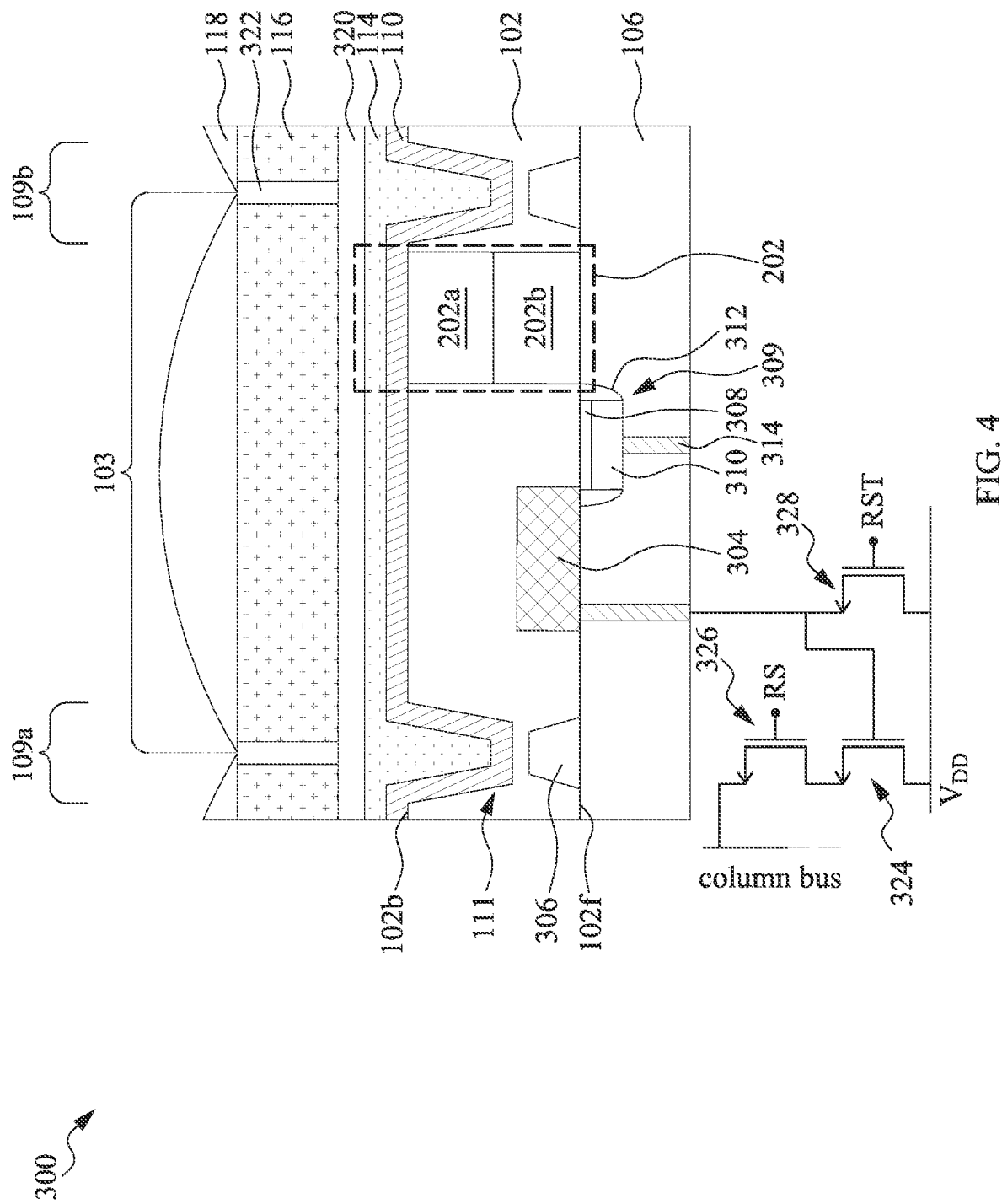
FIG. 4 illustrates a cross-sectional view of a back side illuminated (BSI)-CMOS image sensor including a plurality of photodiodes electrically isolated by a BDTI structure with a ferroelectric layer according to an embodiment of the present disclosure.

FIG. 4 illustrate cross-sectional views of some additional embodiments of a BSI-CMOS image sensor 300 including a plurality of photodiodes 202 electrically isolated by a plurality of BDTI structures 111 with a ferroelectric layer 110.

The BSI-CMOS image sensor 300 includes a pixel region 103 arranged within a substrate 102. In some embodiments, the substrate 102 may be a semiconductor substrate. In some embodiments, the pixel region 103 may be electrically isolated from adjacent pixel regions by one or more of BDTI structures 111 arranged within the substrate 102 on the same sides of the pixel region 103. In further embodiments, the pixel region 103 may be electrically isolated from adjacent pixel regions by one or more isolation structures 306 (e.g., shallow trench isolation regions) arranged within the substrate 102. The one or more isolation structures 306 may include an insulating material.

The pixel region 103 includes a photodiode 202 having a first region 202a with a first doping type (e.g., n-type doping) and a second region 202b with a second doping type (e.g., p-type doping) that is different than the first doping type. The first region 202a vertically extends from the second region 202b to a ferroelectric layer 110. In some embodiments, the ferroelectric layer 110 may be arranged along a back-side 102b of the substrate 102.

A transfer transistor 309 is arranged over the front-side 102f of the substrate 102. The transfer transistor 309 includes a gate dielectric layer 308 is disposed over the front-side of the substrate 102 and a gate electrode 310 is arranged onto the gate dielectric layer 308. In some embodiments, sidewall spacers 312 are arranged on opposing sides of the gate electrode 310. The transfer transistor 309 is laterally arranged between the photodiode 202 and a floating diffusion well 304.

An ILD layer 106 is arranged along the front-side 102f of the substrate 102. The ILD layer 106 includes one or more ILD materials. In various embodiments, the ILD layer 106 may include one or more dielectric materials with a dielectric constant less than about 3.9, an ultra low-k dielectric layer, or an oxide (e.g., silicon oxide). Conductive contacts 314 are arranged within the ILD layer 106. The conductive contacts 314 extend from the gate electrode 310 and the floating diffusion well 304 to one or more metal wire layers (not shown in FIG. 4). In various embodiments, the conductive contacts 314 may include a conductive metal such as copper or tungsten, for example.

The plurality of BDTI structures 111 are arranged within the back-side 102b of the substrate 102 along edges of the pixel region 103. The plurality of BDTI structures 111 may include a ferroelectric layer 110. The ferroelectric layer 110 extends along the interface between the plurality of BDTI structures 111 and the substrate 102. Optionally, a high-k dielectric layer 114 may fill in a remainder of the trench and is disposed over the ferroelectric layer 110. In some embodiments, the ferroelectric layer 110 may extend over the back-side 102b of the substrate 102 between adjacent BDTI structures 111. The high-k dielectric layer 114 may extend over the back-side 102b of the substrate 102 between adjacent BDTI structures 111. In some embodiments, the cap layer 112 as described above (not shown in FIG. 4) may be present at the interface between the ferroelectric layer 110 and the high-k dielectric layer 114. In some embodiments, an anti-reflective coating (ARC) (not shown in FIG. 4), such as a bottom resist anti-reflective coating (BARC), may be present at the interface between the ferroelectric layer and the one ore more high-k dielectric materials. In some embodiments, an ARC, such as a BARC, may be present at the interface between the ferroelectric layer 110 and the substrate 102.

A layer of dielectric material 320 vertically separates a plurality of color filters 116 from the back-side 102b of the substrate 102. In some embodiments, the plurality of color filters 116 may be arranged within a grid structure 322 disposed onto the layer of dielectric material 320. In some embodiments, the grid structure 322 may include a stacked grid having a metal framework surrounded by a dielectric material. In some embodiments, layer of dielectric material 320 and the stacked grid may have a same dielectric material (e.g., silicon-dioxide ($SiO_2$)).

A plurality of micro-lenses 118 are arranged over the plurality of color filters 116. In some embodiments, the plurality of micro-lenses 118 have a substantially flat bottom surface abutting the plurality of color filters 116 and a curved upper surface. The curved upper surface is configured to focus incident radiation towards the underlying pixel region 103.

During operation of the BSI-CMOS image sensor 300 incident radiation is focused by the micro-lens 118 to the underlying pixel region 103. When incident radiation of sufficient energy strikes the photodiode 202, it generates an electron-hole pair that produces a photocurrent. The transfer transistor 309 controls charge transfer from the photodiode 202 to the floating diffusion well 304. If the charge level is sufficiently high within the floating diffusion well 304, a source follower transistor 324 is activated and charges are selectively output according to operation of a row select transistor 326 used for addressing. A reset transistor 328 is configured to reset the photodiode 202 between exposure periods.

FIGS. 5-11, 16 and 17 illustrate some embodiments of cross-sectional views showing a operation of forming a CMOS-BSI image sensor 300 having a plurality of BDTI structures 111 with an ferroelectric layer 110. FIGS. 12 to 15 illustrate possible polarization-electric field curves and x-ray diffraction patterns of the ferroelectric layer 110 before and after an anneal operation.

Figure 5:
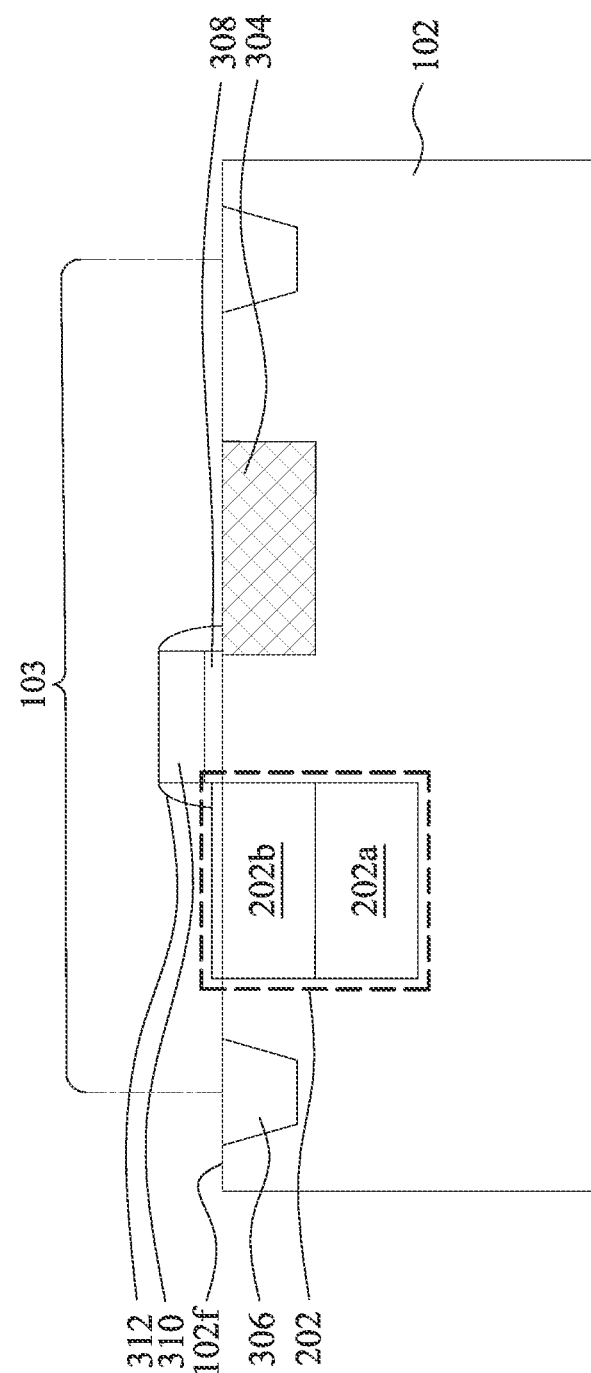
FIGS. 5-11, 16 and 17 illustrate some embodiments of cross-sectional views showing an operation of forming a CMOS-BSI image sensor having a BDTI structure with a ferroelectric layer shown in FIG. 4.

As shown in the cross-sectional view of FIG. 5, a transfer transistor 309 is formed over a front-side 102f of a substrate 102. In some embodiments, the substrate 102 may include any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith. In various embodiments, the substrate 102 may be selectively implanted according to a patterned masking layer (not shown) including photoresist. The transfer transistor 309 may be formed by depositing a gate dielectric film and a gate electrode film over the substrate 102. The gate dielectric film and the gate electrode film are subsequently patterned to form a gate dielectric layer 308 and a gate electrode 310. Sidewall spacers 312 may be formed on the outer sidewalls of the gate electrode 310. In some embodiments, the sidewall spacers 312 may be formed by depositing nitride onto the front-side 102f of the substrate 102 and selectively etching the nitride to form the sidewall spacers 312.

To form a photodiode 202 along a first-side of the transfer transistor 309 and a floating diffusion well 304 along an opposite, second side of the transfer transistor 309, implantation operations are performed within the front-side 102f of the substrate 102. The photodiode 202 may be formed by selectively implanting the substrate 102 with a first implantation operation to form a first region 202a having a first doping type (e.g., n-type), and a second subsequent implantation operation to form an abutting second region 202b having a second doping type (e.g., p-type) different than the first doping type.

Optionally, one or more isolation structures 306 (e.g., shallow trench isolation regions) may be formed within the front-side 102f of the substrate 102. The one or more isolation structures 306 may be formed by selectively etching the front-side 102f of the substrate 102 to form shallow-trenches and subsequently forming an oxide within the shallow-trenches. In some embodiments, the one or more isolation structures 306 may be formed prior to formation of the transfer transistor 309, the photodiode 202, and/or the floating diffusion well 304.

Figure 6:
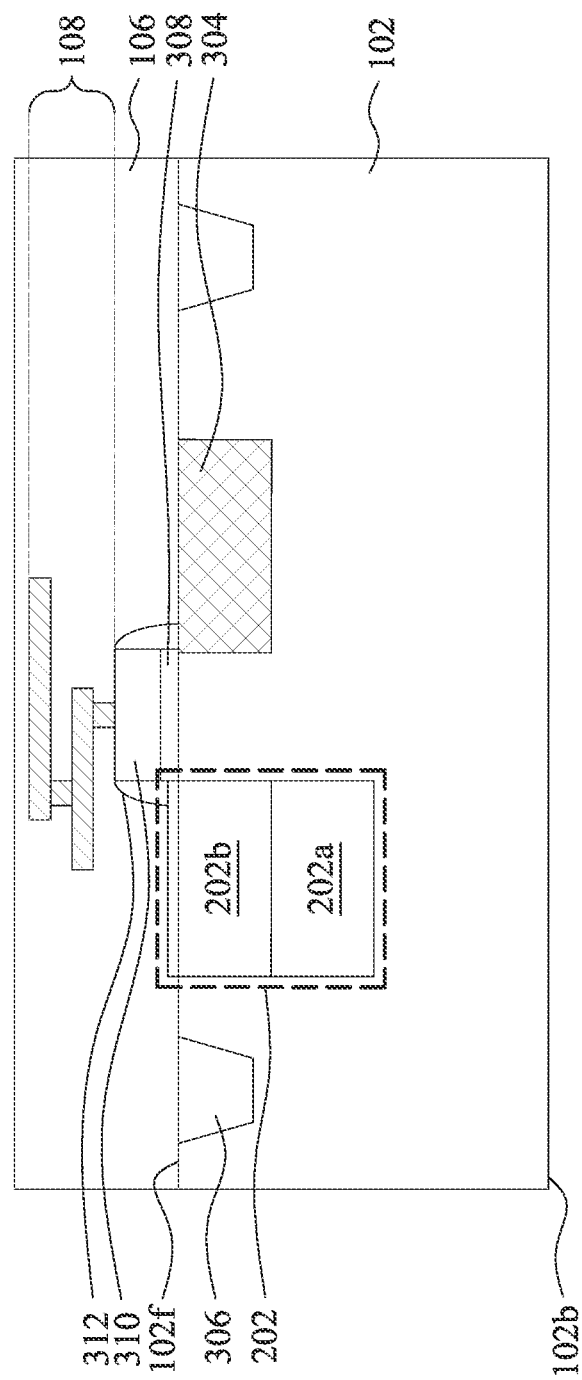

As shown in the cross-sectional view of FIG. 6, a line stack, e.g. a BEOL metallization stack, including a plurality of metal interconnect layers 108 arranged within an ILD layer 106 is formed over the front-side 102f of the substrate 102. In some embodiments, the line stack may be formed by forming the ILD layer 106, which includes one or more layers of ILD material, over the front-side 102f of the substrate 102. The ILD layer 106 is subsequently etched to form via holes and/or metal trenches. The via holes and/or metal trenches are then filled with a conductive material to form the plurality of metal interconnect layers 108. In some embodiments, the ILD layer 106 may be deposited by a physical vapor deposition technique (e.g., PVD, CVD, etc.). The plurality of metal interconnect layers 108 may be formed using a deposition operation and/or a plating operation (e.g., electroplating, electro-less plating, etc.). In various embodiments, the plurality of metal interconnect layers 108 may include tungsten, copper, or aluminum copper, for example.

Figure 7:
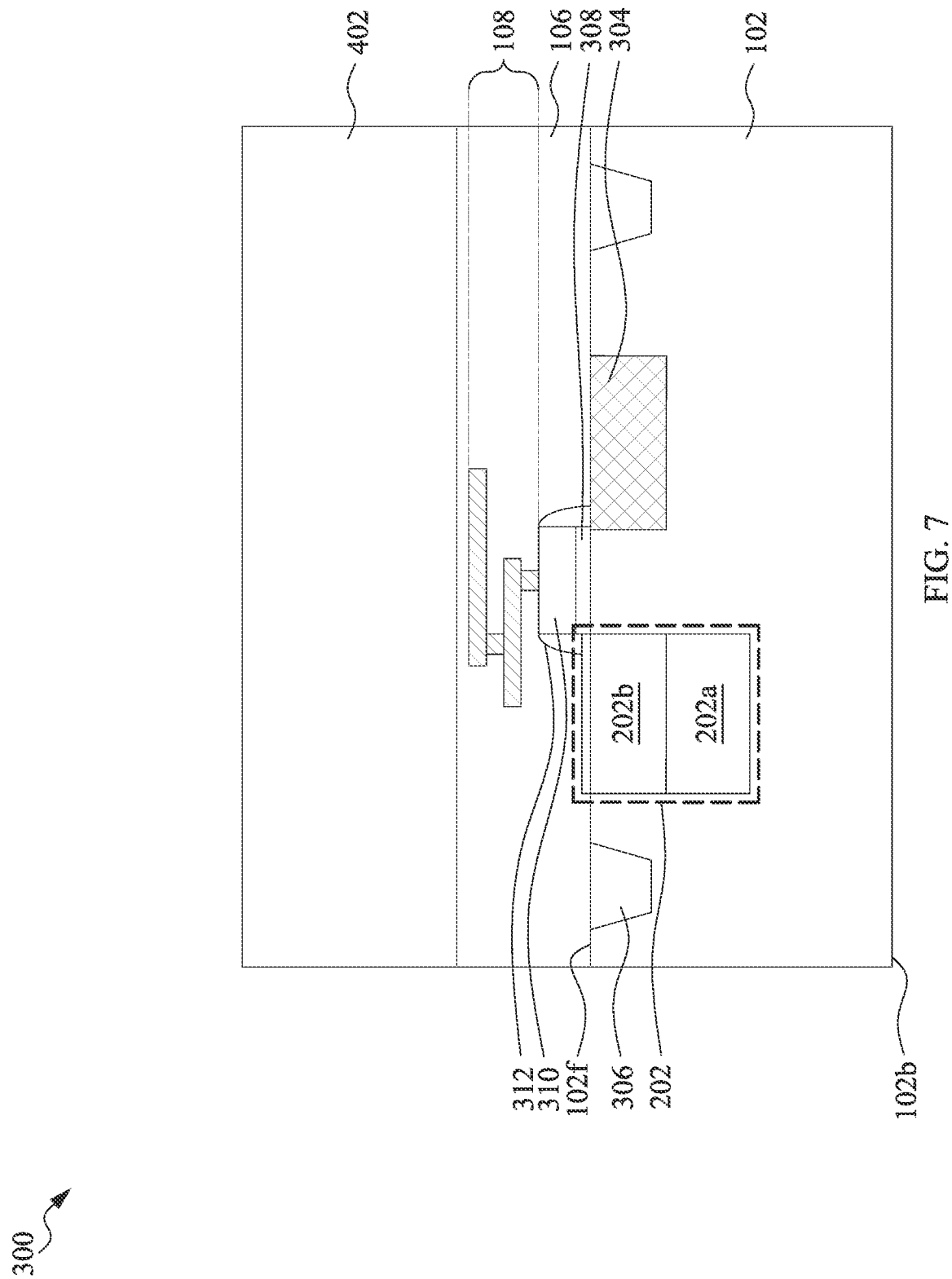

As shown in the cross-sectional view of FIG. 7, the ILD layer 106 is bonded to a handle substrate 402. In some embodiments, the bonding operation may use an intermediate bonding oxide layer (not shown in FIG. 7) arranged between the ILD layer 106 and the handle substrate 402. In some embodiments, the bonding operation may include a fusion bonding operation. In some embodiments, the handle substrate 402 may include a silicon wafer.

Figure 8:
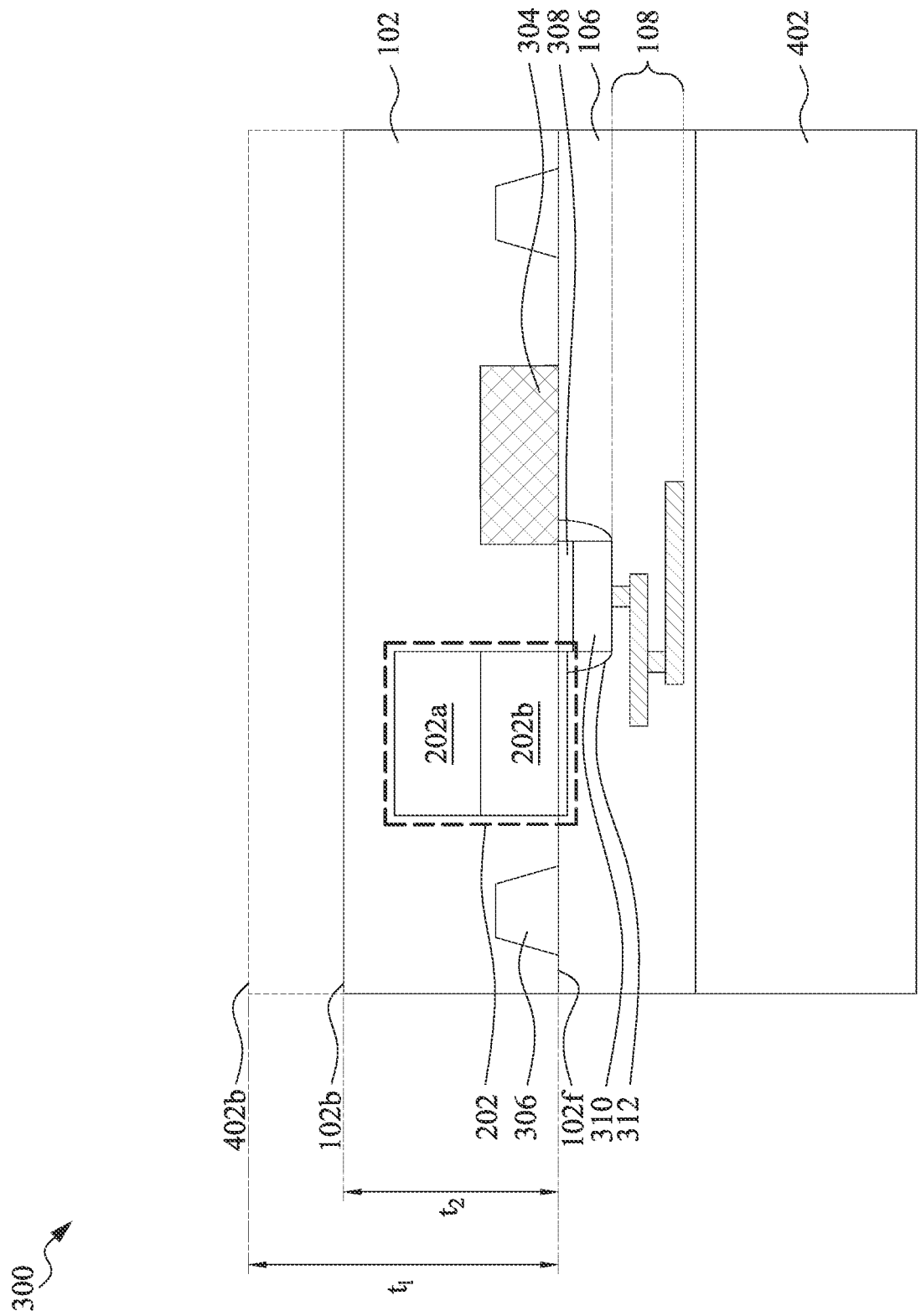

As shown in the cross-sectional view of FIG. 8, a thickness of the substrate 102 is reduced. Thinning the substrate 102 reduces a thickness of the substrate from a first thickness $t_1$ to a second thickness $t_2$ to allow for incident radiation to pass through the back-side 102b of the substrate 102 to the photodiode 202. In some embodiments, the substrate 102 may be thinned by etching the back-side 102b of the substrate. In other embodiments, the substrate 102 may be thinned by mechanical grinding the back-side 102b of the substrate.

Figure 9:
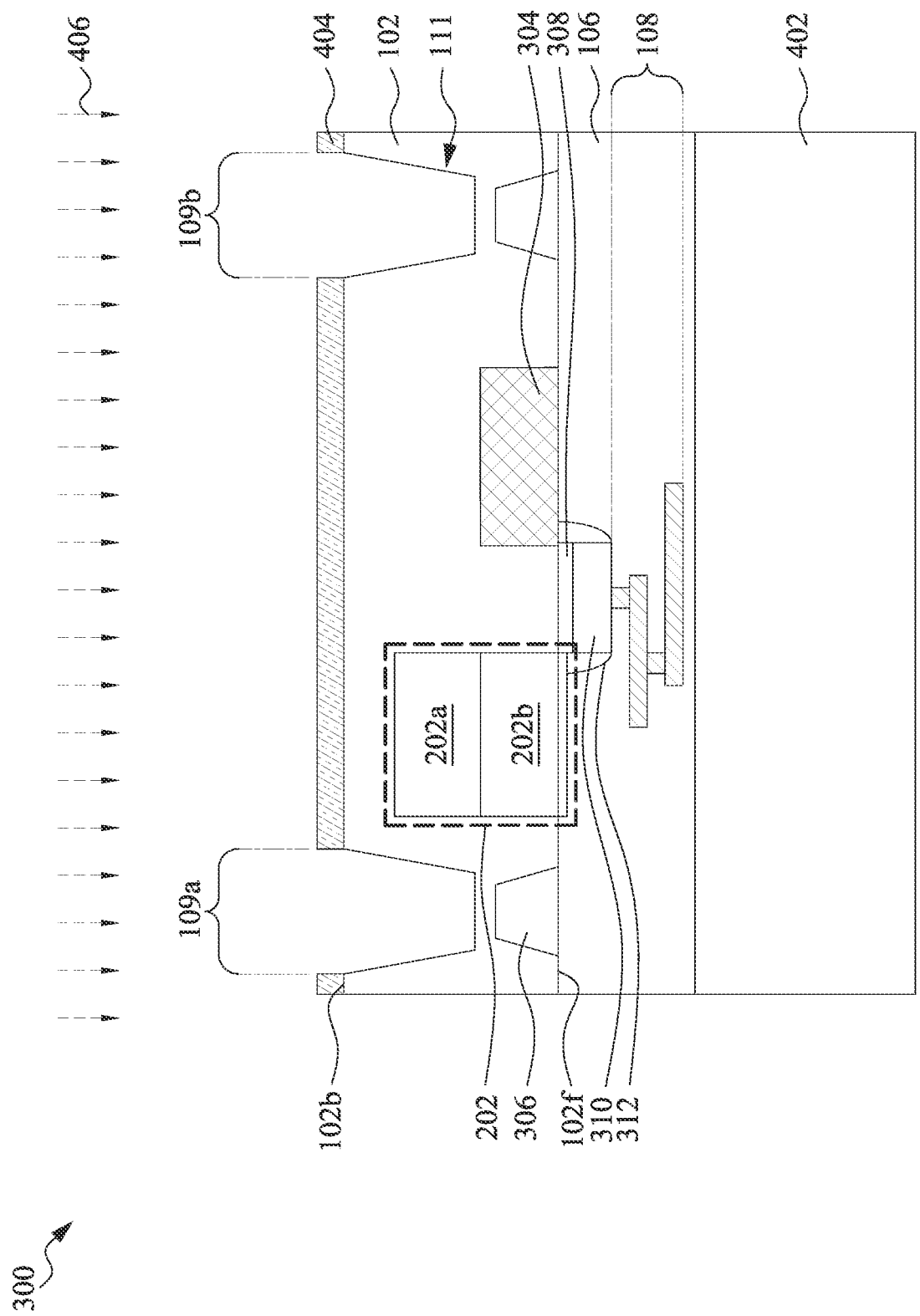

As shown in the cross-sectional view of FIG. 9, the substrate 102 is selectively etched to form deep trenches 109a and 109b within the back-side 102b of the substrate 102. In some embodiments, the substrate 102 may be etched by forming a masking layer 404 onto the back-side 102b of the substrate 102. The substrate 102 is then exposed to an etchant 406 in regions not covered by the masking layer 404. The etchant 406 etches the substrate 102 to form deep trenches 109a and 109b extending to the substrate 102. The deep trenches 109a and 109b extend to a position within the substrate 102 that is laterally separated the photodiode 202 for the other photodiodes.

In various embodiments, the masking layer 404 may include photoresist or a nitride (e.g., SiN) patterned using a photolithography operation. In various embodiments, the etchant 406 may include a dry etchant have an etching chemistry including a fluorine species (e.g., $CF_4$, $CHF_3$, $C4F_8$, etc.) or a wet etchant (e.g., hydroflouric acid (HF) or tetramethylammonium hydroxide (TMAH)).

Figure 10:
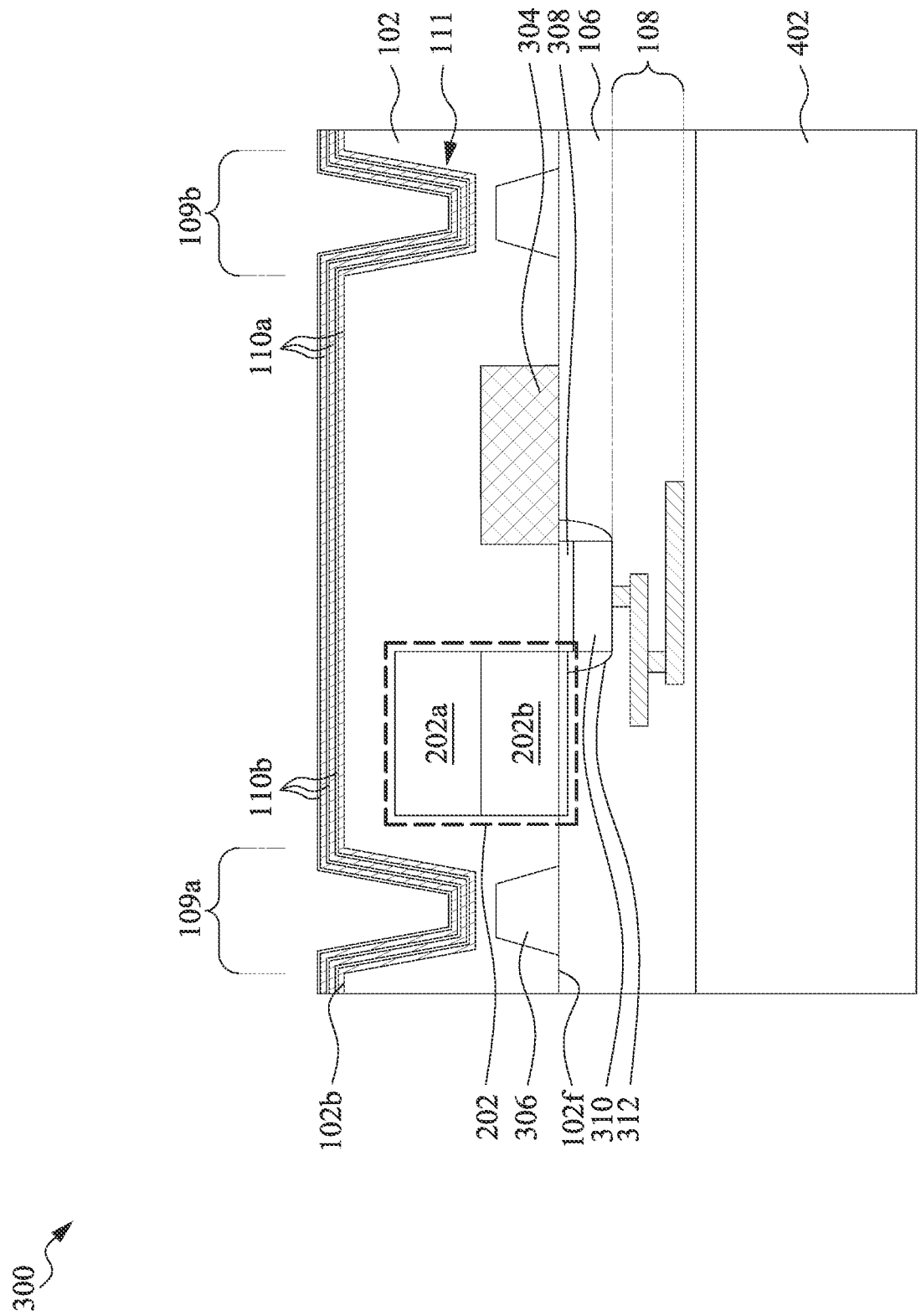

As shown in the cross-sectional view of FIG. 10, a ferroelectric layer 110 is disposed within the deep trenches 109a and 109b. In some embodiments, the ferroelectric layer 110 may be conformally disposed within the deep trenches 109a and 109b. The ferroelectric layer 110 extends along the between the plurality of BDTI structures 111 and the substrate 110. In some embodiments, the ferroelectric layer 110 may extend over the back-side 102b of the substrate 102 between adjacent BDTI structures 111. In some embodiments, the ferroelectric layer 110 may be formed via a physical vapor deposition technique, such as thermal ALD and PEALD. In further embodiments, the ferroelectric layer 110 is formed by in-situ doping a dopant along with Hf-containing precursor during ALD. The dopant includes Si, Zr, Al, La Y, Gd, Sr, or the like. The concentration of the dopant may range from 1 to 99 atomic %, for example but being not limited to: 1, 5, 10, 15, 20, 25, 30, 35, 40, 45, 50, 55, 60, 65, 70, 75, 80, 85, 90, 95 or 99 atomic %. The precursor may be, for example, $HfCl_4$, $HfI_4$, TDMA-Hf, TEMA-Hf, or the like. In some embodiments, an oxidant may be used to facilitate the reaction, and the oxidant may be, for example, $O_3$, $H_2O$, $O_2$, or the like. In some embodiments, the ferroelectric layer 110 formation is conducted at a temperature of about 100° C. to 500° C. and a working pressure of about 0.1 torr to 300 torr for 0.01 second to 200 seconds. The resulting ferroelectric layer 110 has a thickness between about 0.1 nm to 50 nm.

In some embodiments, the ferroelectric layer 110 can be formed by alternatively stacking a high-k dielectric layer 110a and a dopant-containing layer 110b within the deep trenches 109a and 109b. In some embodiments, the ferroelectric layer 110 can be formed by alternatively stacking a high-k dielectric layer 110a and a dopant-containing layer 110b over the back-side 102b of the substrate 102. The proportion of the dopant in the ferroelectric layer 110 can be controlled by manipulating the thickness proportion between the high-k dielectric layer(s) 110a and the dopant-containing layer(s) 110b. For example, if hafnium oxide doped with 50% Zr is selected as the ferroelectric layer 110, a hafnium oxide monolayer and a zirconium oxide monolayer with substantially the same thicknesses may be alternatively disposed within the deep trenches 109a and 109b.

If the ferroelectric layer 110 including the stack of one or more high-k dielectric layers 110a and one or more dopant-containing layers 110b has an amorphous structure and does not exhibit any ferroelectricity, an anneal operation may be performed on the ferroelectric layer 110. As shown in the cross-sectional view of FIG. 11, an anneal operation is performed on the stack of one or more high-k dielectric layers 110a and one or more dopant-containing layers 110b according to some embodiments of the present disclosure. When the ferroelectric layer 110 is annealed, it crystallizes to form the high temperature tetragonal modification. As such, the annealed ferroelectric layer 110 is ferroelectric and has an orthorhombic phase. In some embodiments, the anneal operation can be a spike anneal operation, soak anneal operation, or other suitable anneal operation. The anneal operation may be performed at a temperature in a range of about 400° C. to about 1000° C.

In some embodiment, before the anneal operation, a cap layer 112 can be optionally disposed over the ferroelectric layer 110. The cap layer 112 may be disposed over the high-k dielectric layer 110a. The cap layer 112 may be disposed over the dopant-containing layer(s) 110b. The cap layer 112 may include any metals suitable for a metallization operation for BSI-CMOS image sensor 300 and their associated nitrides (e.g. TiN, TaN, W$_2$N, TiSiN, TaSiN) or other materials such as Pt, Au, W, or combinations thereof. The cap layer 112 may be deposited by PVD, CVD, metal-organic chemical vapor deposition (MOCVD) and ALD. Thus, in other embodiments, the anneal operation may be performed on the cap layer 112 and the stack of a high-k dielectric layer 110a and a dopant-containing layer 110b. During the cooling operation of the anneal operation, the cap layer 112 may provide mechanical stress from the high temperature tetragonal phase of the ferroelectric layer 110 to the high pressure ferroelectric orthorhombic phase to that the annealed ferroelectric layer 110 has ferroelectricity and an orthorhombic phase in a great extent. In some embodiments, after the anneal operation, the cap layer 112 can be either retained or removed depending on the optical or electrical requirements of pixel design.

The ferroelectric layer 110 either being subjected to the anneal operation or not is expected to be ferroelectric and have an orthorhombic crystal structure. If the ferroelectric layer 110 does not have ferroelectricity and/or have a crystal structure other than the orthorhombic structure, the annealed ferroelectric layer 110 can be considered failed to comply with the requirements of the present disclosure. In some embodiments, a variety of measurement techniques, such as piezoresponse force microscopy (PFM) and X-ray diffraction (XRD), may be performed during the formation of the ferroelectric layer 110. As such, the ferroelectricity and the crystal structure of the ferroelectric layer 110 can be obtained.

The PFM pertains to one of the scanning probe microscopy (SPM) techniques in which periodic bias is applied to a conductive tip in contact with a surface. The bias results in periodic surface displacement due to inverse piezoelectric effect or electrostriction of a ferroelectric surface. Mapping of the amplitude and phase of the displacement provides information of ferroelectric-paraelectric domain structures. XRD is a technique for studying the crystal structure of a structure. In XRD, a sample is irradiated by a monochromatic X-ray beam, and the locations and intensities of the diffraction peaks are measured. The characteristic diffraction angles and the intensity of the diffracted radiation depend on the lattice planes of the sample under study and the atoms that make up the crystalline material. For a given wavelength and lattice plane spacing, diffraction peaks will be observed when the X-ray beam is incident on a lattice plane at angles that satisfy the Bragg condition.

Figure 12:
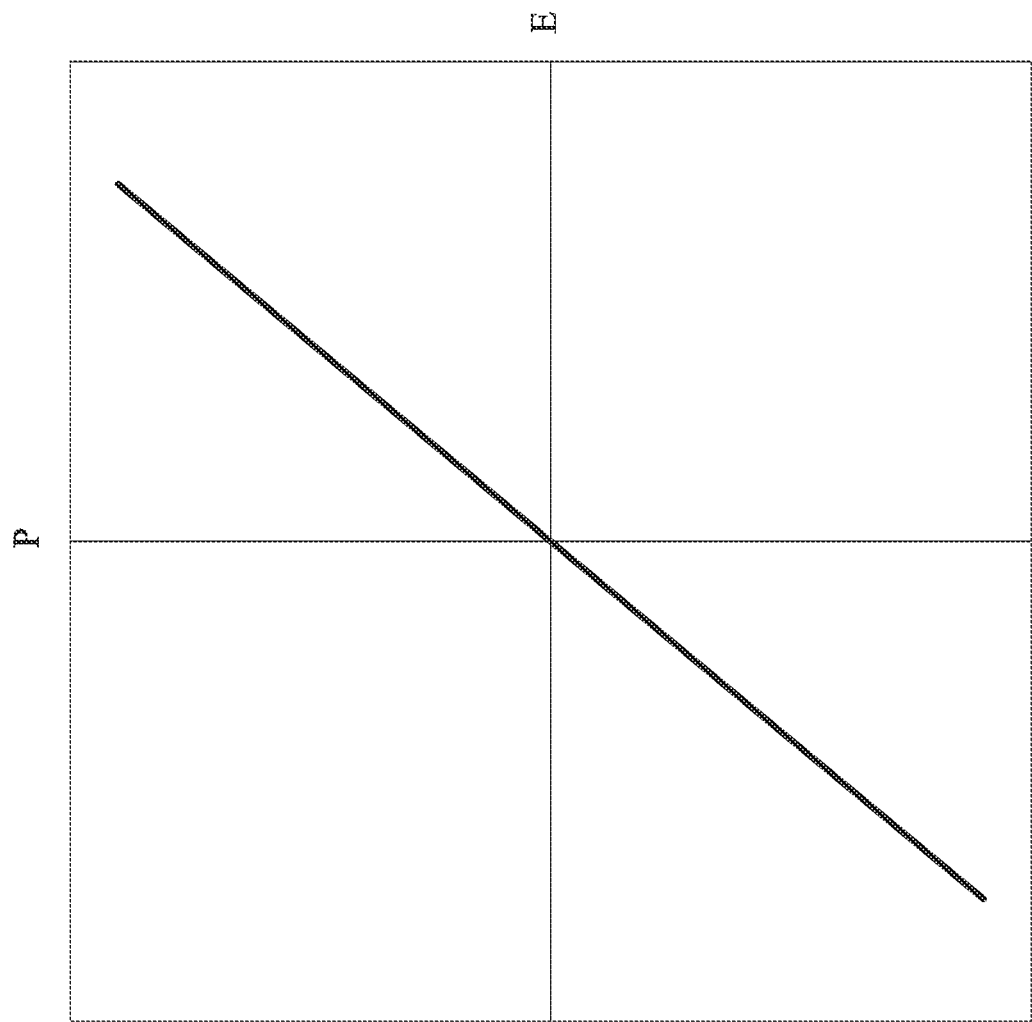
FIG. 12 illustrates a possible polarization-electric field curve of the ferroelectric layer before an anneal operation.
Figure 13:
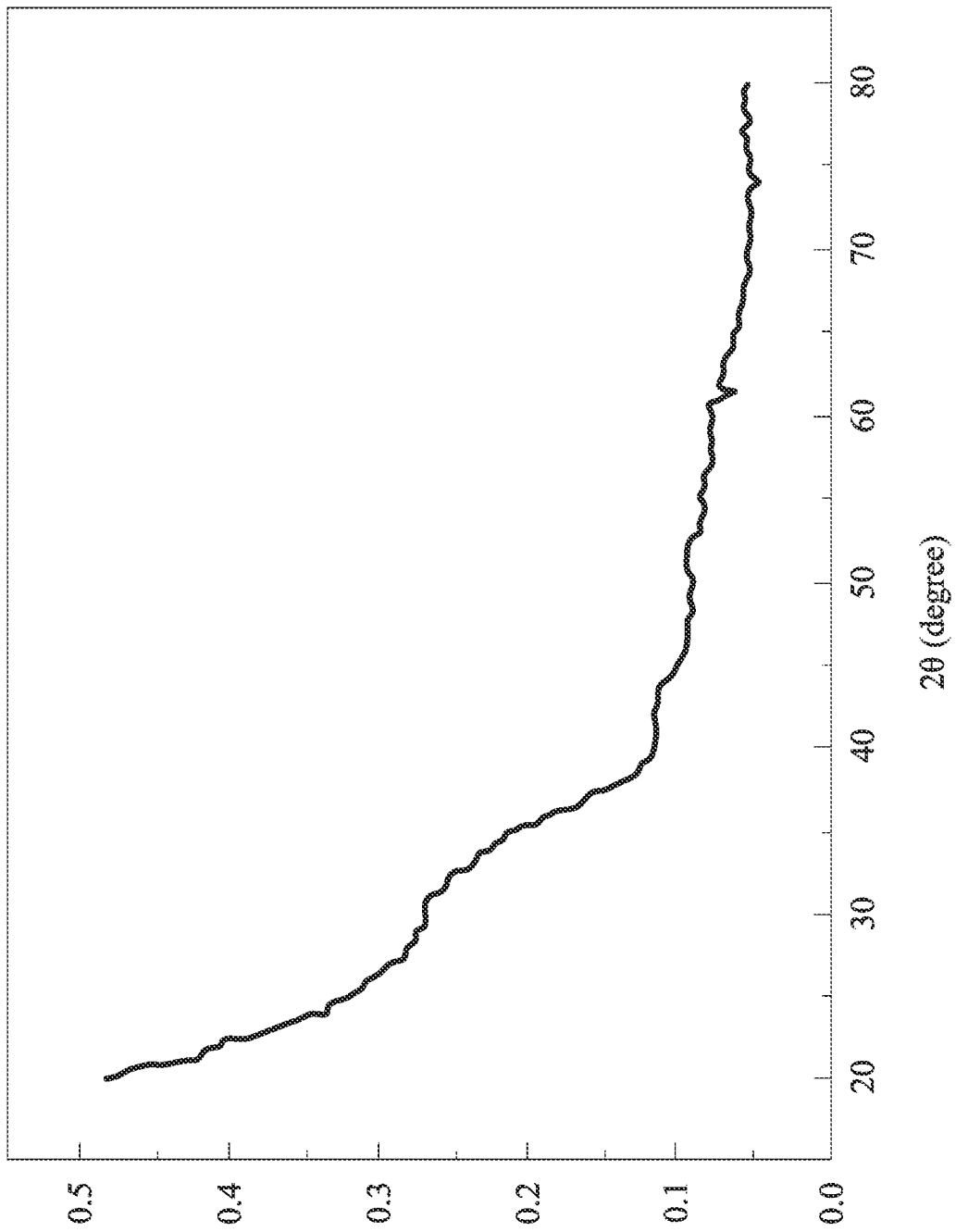
FIG. 13 illustrates a possible x-ray diffraction pattern of the ferroelectric layer before an anneal operation.

FIG. 12 illustrates a possible polarization-electric field curve of the ferroelectric layer 110 before the anneal operation, and FIG. 13 illustrates a possible x-ray diffraction pattern of the ferroelectric layer 110 before the anneal operation. In this stage, the ferroelectric layer 110 is expected to be paraelectric (as shown in FIG. 12) and have an amorphous crystal structure (as shown in FIG. 13).

Figure 14:
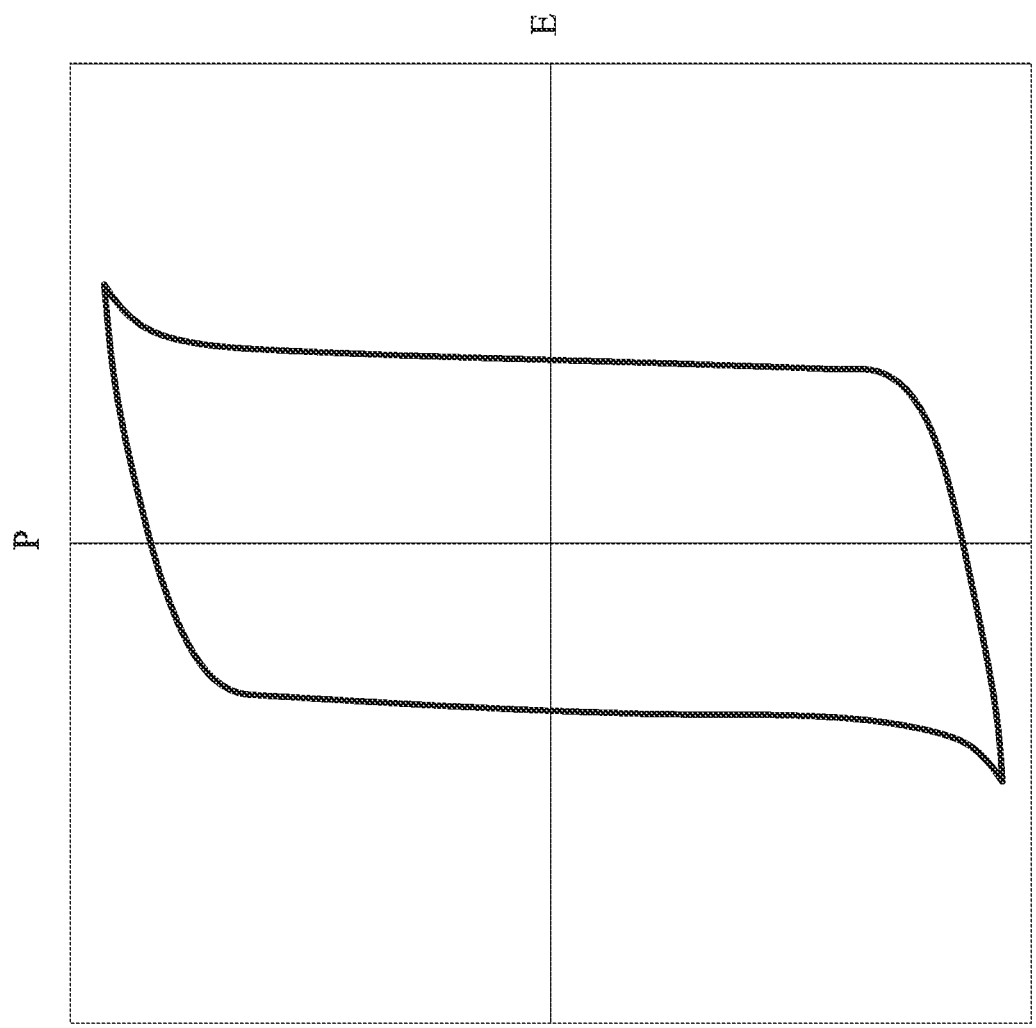
FIG. 14 illustrates a possible polarization-electric field curve of the annealed ferroelectric layer after an anneal operation.
Figure 15:
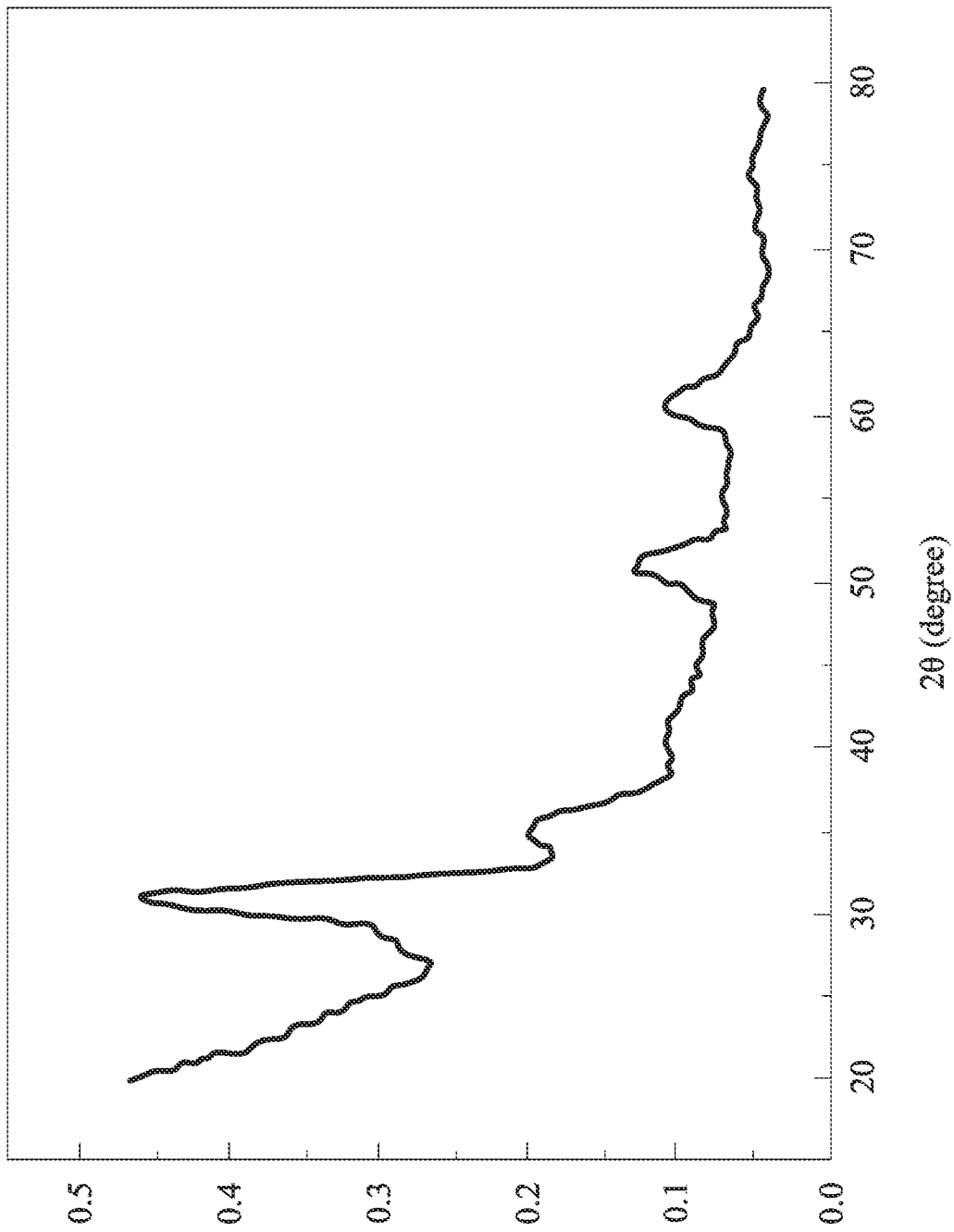
FIG. 15 illustrates a possible x-ray diffraction pattern of the annealed ferroelectric layer after an anneal operation.

FIG. 14 illustrates a possible polarization-electric field curve with a hysteresis loop of the ferroelectric layer 110 after the anneal operation, and FIG. 15 illustrates a possible x-ray diffraction pattern of the ferroelectric layer 110 after the anneal operation. In this stage, the annealed ferroelectric layer 110 is expected to be ferroelectric (as shown in FIG. 14) and have an orthorhombic crystal structure (as shown in FIG. 15).

Figure 16:
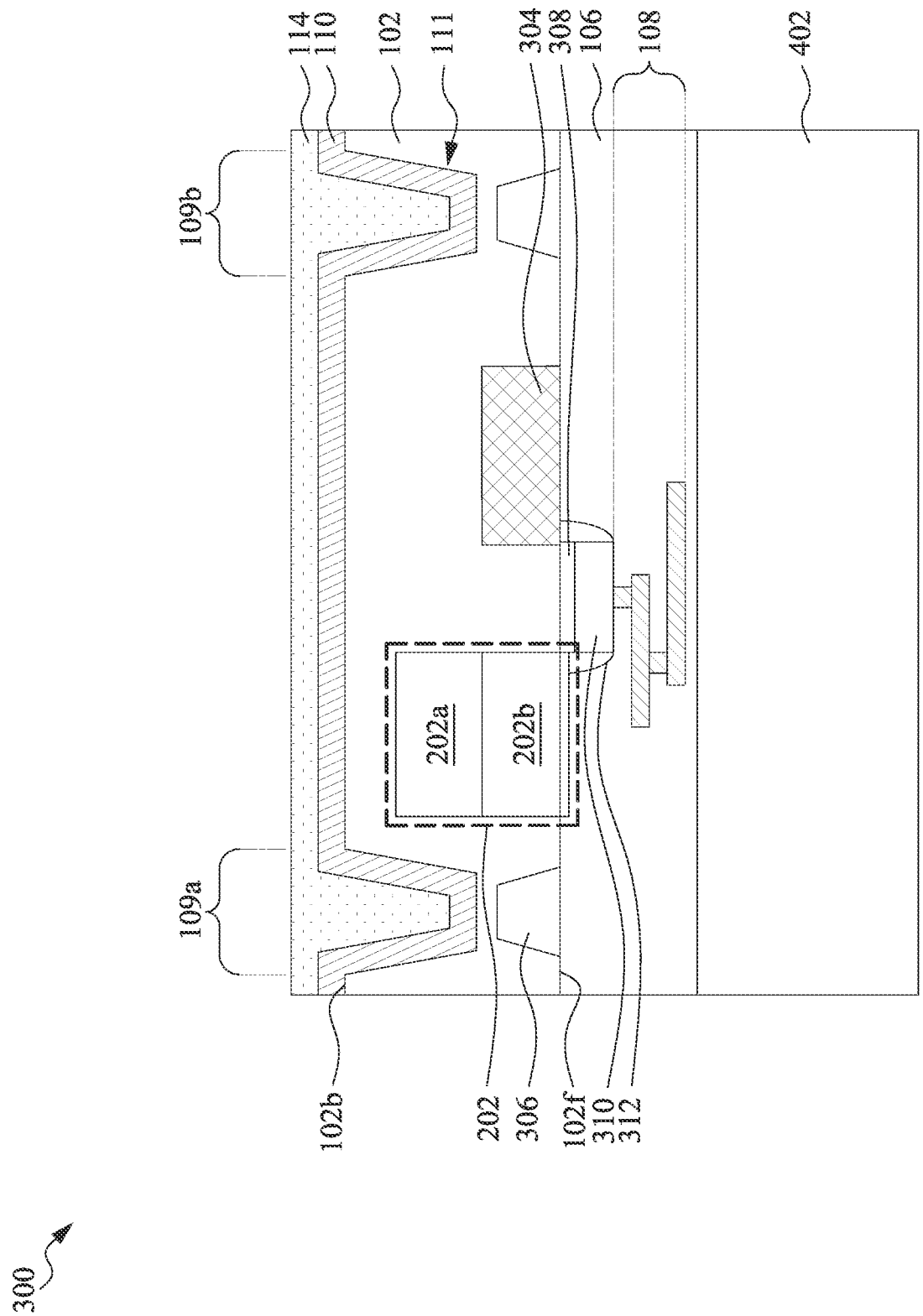

As shown in the cross-sectional view of FIG. 16, in some embodiments, a high-k dielectric layer 114 may be optionally disposed over the ferroelectric layer 110. If the high-k dielectric layer 114 is present, the high-k dielectric layer 114 may conformally disposed over the ferroelectric layer 110. In some embodiments, the high-k dielectric layer 114 may extend over the back-side 102b of the substrate 102 between adjacent BDTI structures 111. The high-k dielectric layer 114 may extend over the ferroelectric layer 110 between adjacent BDTI structures 111. In some embodiments, a planarization operation is performed after forming the high-k dielectric layer 114 to form a planar surface that extends along an upper surface of the high-k dielectric layer 114. In some embodiments, the high-k dielectric layer 114 may be deposited using a physical vapor deposition technique.

Figure 17:
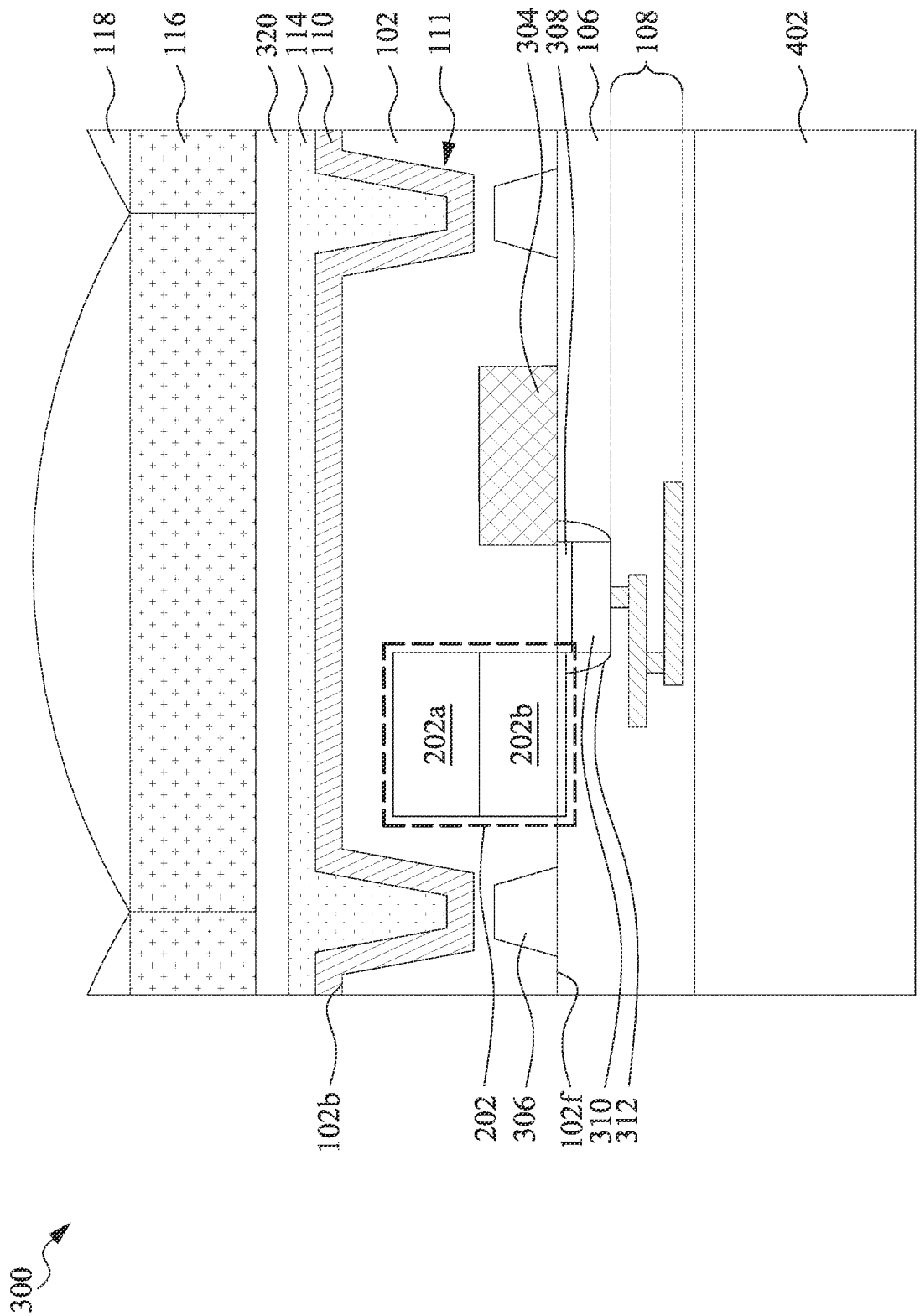

As shown in the cross-sectional view of FIG. 17, a plurality of color filters 116 are formed over the back-side 102b of the substrate 102. In some embodiments, the plurality of color filters 116 may be formed by forming a color filter layer and patterning the color filter layer. The color filter layer is formed of a material that allows for the transmission of radiation (e.g., light) having a specific range of wavelength, while blocking light of wavelengths outside of the specified range. Further, in some embodiments, the color filter layer is planarized subsequent to formation.

A plurality of micro-lenses 118 are formed over the plurality of color filters 116. In some embodiments, the plurality of micro-lenses 118 may be formed by depositing a micro-lens material above the plurality of color filters 116 (e.g., by a spin-on operation or a deposition operation). A micro-lens template (not shown in FIG. 17) having a curved upper surface is patterned above the micro-lens material. In some embodiments, the micro-lens template may include a photoresist material exposed using a distributing exposing light dose (e.g., for a negative photoresist more light is exposed at a bottom of the curvature and less light is exposed at a top of the curvature), developed and baked to form a rounding shape. The plurality of micro-lenses 118 are then formed by selectively etching the micro-lens material according to the micro-lens template.

Figure 18:
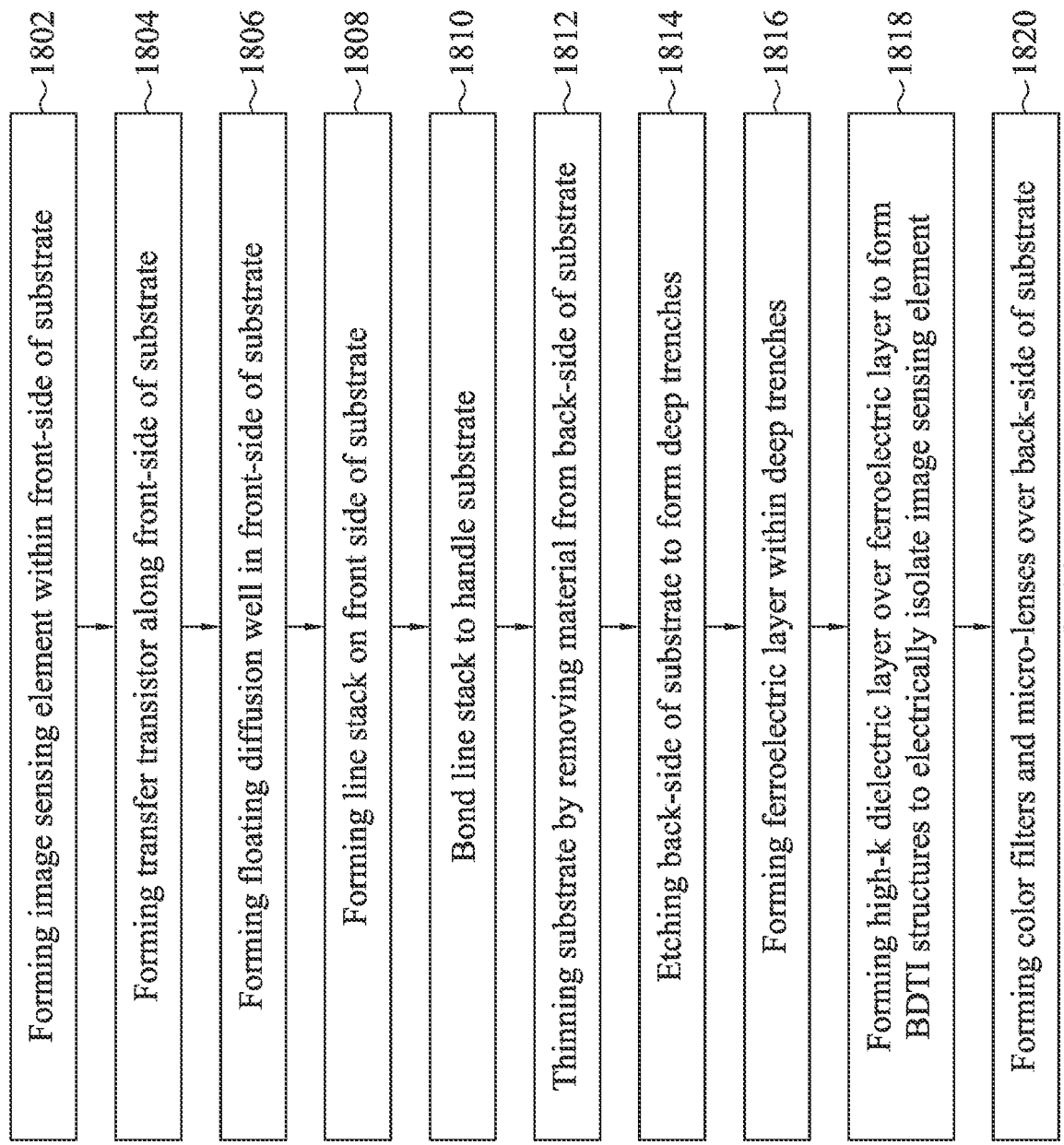
FIG. 18 illustrates a flow diagram of forming a CMOS-BSI image sensor having a BDTI structure with a ferroelectric layer according to some embodiments of the present disclosure.

FIG. 18 illustrates a flow diagram of some additional embodiments of an operation 1800 of forming a CMOS-BSI image sensor having a plurality of light sensing elements electrically isolated by a plurality of BDTI structures with a ferroelectric layer.

While disclosed operation 1800 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1802, an image sensing element is formed within the front-side of a substrate. In some embodiments, the image sensing element may include a photodiode formed by implanting dopant species into the front-side of the substrate. FIG. 5 illustrates a cross-sectional view corresponding to some embodiments corresponding to act 1802.

At 1804, a transfer transistor is formed along the front-side of the substrate. FIG. 5 illustrates a cross-sectional view corresponding to some embodiments corresponding to act 1804.

At 1806, a floating diffusion well is formed within the front-side of the substrate. FIG. 5 illustrates a cross-sectional view corresponding to some embodiments corresponding to act 1806.

At 1808, a line stack is formed over the transfer transistor on the front-side of the substrate. FIG. 6 illustrates a cross-sectional view corresponding to some embodiments corresponding to act 1808.

At 1810, the line stack is bonded to a handle substrate. FIG. 7 illustrates a cross-sectional view corresponding to some embodiments corresponding to act 1810.

At 1812, the substrate is thinned by removing material from a back-side of the substrate. FIG. 8 illustrates a cross-sectional view corresponding to some embodiments corresponding to act 1812.

At 1814, the back-side of the substrate is selectively etched to form deep trenches extending into the substrate. FIG. 9 illustrates a cross-sectional view corresponding to some embodiments corresponding to act 1814.

Figure 11:
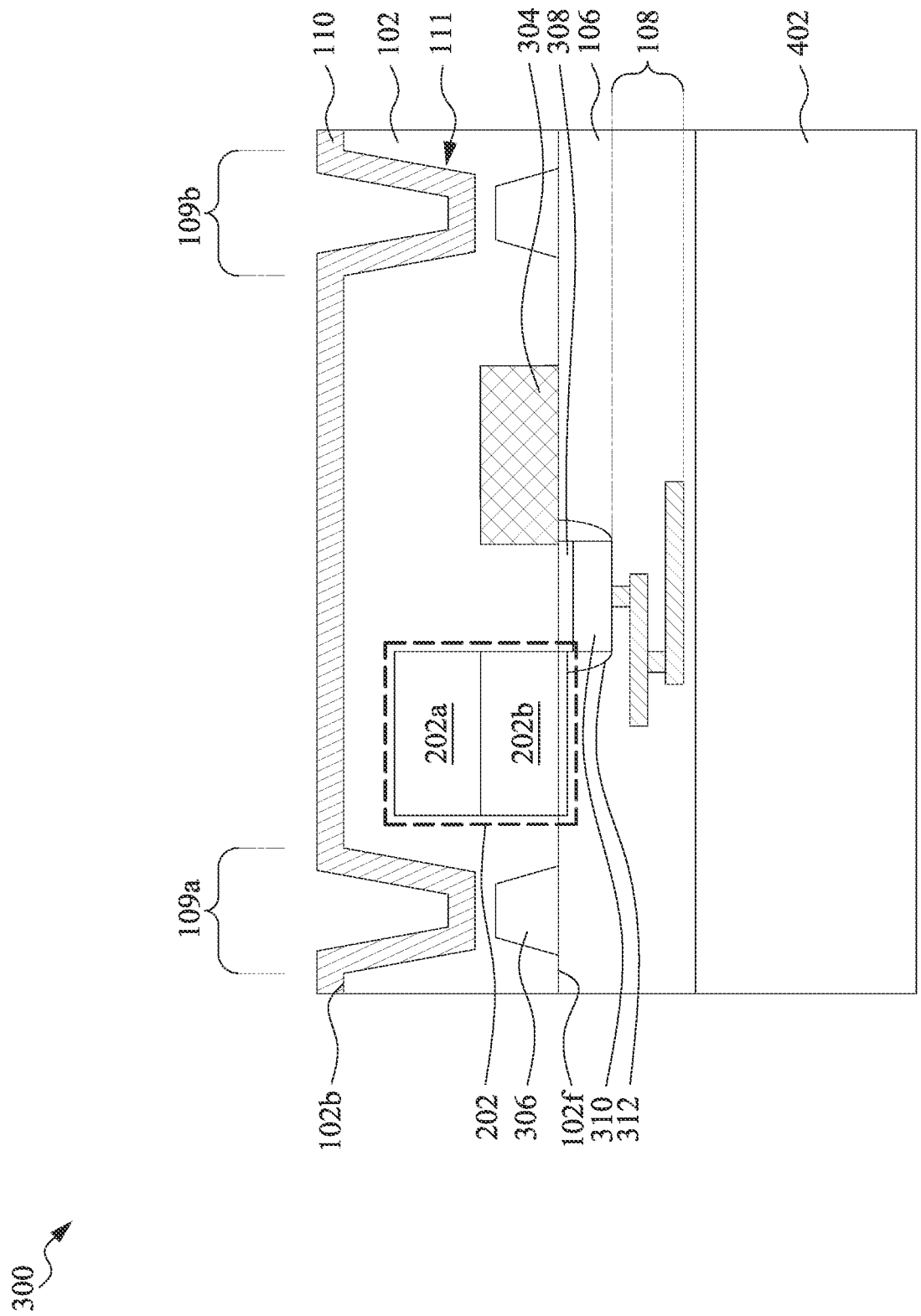

At 1816, a ferroelectric layer is disposed within the deep trenches and covers the sidewalls and bottom surfaces of the deep trenches. Optionally, the ferroelectric layer is annealed. FIGS. 10 and 11 illustrates cross-sectional views corresponding to some embodiments corresponding to act 1816.

At 1818, one or more high-k dielectric layer are disposed over the ferroelectric layer and with the deep trenches to produce BDTI structures that electrically isolate the image sensing elements from each other. FIG. 16 illustrates a cross-sectional view corresponding to some embodiments corresponding to act 1818.

At 1820, color filters and micro-lenses are formed over the back-side of the substrate. FIG. 17 illustrates a cross-sectional view corresponding to some embodiments corresponding to act 1820.

Therefore, the present disclosure relates to a CMOS image sensor including a plurality of BDTI structures with a ferroelectric layer, which is configured to reduce dark current and white pixel number, and an associated formation operation.

In view of the foregoing, some embodiments of the present application provide a semiconductor device, including: a pixel region disposed within a substrate and comprising an image sensing element configured to convert electromagnetic radiation into an electrical signal; and one or more BDTI structures extending from a first-side of the substrate to positions within the substrate; wherein the one or more of BDTI structures comprise one or more ferroelectric materials.

Further, other embodiments of the present application provide a BDTI structure of a semiconductor device, including a substrate and a BDTI structure extending from a first side of the substrate to a position within the substrate, wherein the BDTI structure comprising an undoped dielectric layer and a doped dielectric layer, wherein the doped dielectric layer vertically and laterally separate the undoped dielectric layer from the substrate.

Further yet, other embodiments of the present application provide a method of manufacturing a semiconductor structure, including: providing a substrate; forming one or more trenches extending from a first-side of the substrate to positions within the substrate; providing a dielectric layer within the one or more trenches; providing a dopant-containing layer within the one or more trenches; and annealing the dielectric layer and dopant-containing layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a pixel region disposed within a substrate and comprising an image sensing element configured to convert electromagnetic radiation into an electrical signal;
   one or more back-side deep trench isolation (BDTI) structures extending from a first side of the substrate to positions within the substrate; and
   one or more front-side isolation structures extending from a second side of the substrate to positions within the substrate, wherein the second side of the substrate opposites to the first side of the substrate,
   wherein the one or more BDTI structures comprise a ferroelectric layer including one or more ferroelectric materials, and a cap layer formed over the ferroelectric layer and including metals, metal nitrides or combinations thereof; and
   wherein a bottom of the image sensing element is coplanar with the second side of the substrate.

2. The semiconductor device of claim 1, wherein the one or more ferroelectric materials have a dielectric constant equal to or greater than 3.9.

3. The semiconductor device of claim 1, wherein the one or more ferroelectric materials extend along an interface between the one or more BDTI structures and the substrate.

4. The semiconductor device of claim 1, wherein the one or more BDTI structures further comprise one or more dielectric layers, and wherein the one or more ferroelectric materials vertically and laterally separate the one or more dielectric layers from the substrate.

5. The semiconductor device of claim 1, wherein the one or more ferroelectric materials laterally extend over the first side of the substrate between adjacent BDTI structures.

6. The semiconductor device of claim 1, wherein the one or more ferroelectric materials have a thickness between about 0.1 nm to about 50 nm.

7. The semiconductor device of claim 1,
   wherein the image sensing element comprises a photodiode having a first region with a first doping type and a second region with a second doping type that is different than the first doping type.

8. The semiconductor device of claim 1, wherein the one or more BDTI structures vertically extend from the first side of the substrate to a position that laterally isolate the image sensing element.

9. The semiconductor device of claim 1, further comprising:
a line stack arranged on a second side of the substrate and comprising a plurality of metal interconnect layers arranged within one or more inter-level dielectric layers, so that the bottom of the image sensing element abuts an uppermost inter-level dielectric layer of the one or more inter-level dielectric layers.

10. A back-side deep trench isolation (BDTI) structure of a semiconductor device, comprising
a substrate;
a pixel region disposed within the substrate and comprising an image sensing element configured to convert electromagnetic radiation into an electrical signal;
a BDTI structure extending from a first side of the substrate to a position within the substrate; and
a front-side isolation structure extending from a second side of the substrate to a position within the substrate, wherein the second side of the substrate opposites to the first side of the substrate,
wherein the BDTI structure comprises an undoped dielectric layer, a doped dielectric layer formed on the undoped dielectric layer, and a cap layer formed over the doped dielectric layer and including metals, metal nitrides or combinations thereof,
wherein the doped dielectric layer vertically and laterally separates the undoped dielectric layer from the substrate, and
wherein a bottom of the image sensing element is coplanar with a second side of the substrate opposite to the first side of the substrate.

11. The BDTI structure of claim 10, wherein the doped dielectric layer has an orthorhombic crystal structure.

12. The BDTI structure of claim 10, wherein the undoped dielectric layer is amorphous.

13. The BDTI structure of claim 10, wherein the undoped dielectric layer comprises hafnium oxide, lead zirconate titanate (PZT), lanthanum oxide, aluminium oxide, zirconium oxide, titanium oxide, tantalum oxide, yttrium oxide, strontium titanate (STO), barium titanate (BTO), barium zirconate, hafnium zirconate, hafnium-lanthanum oxide, hafnium-silicon oxide, lanthanum-silicon oxide, aluminium-silicon oxide, hafnium-tantalum oxide, hafnium-titanium oxide, or barium strontium titanate (BST).

14. The BDTI structure of claim 10, wherein the doped dielectric layer comprises hafnium oxide, lead zirconate titanate (PZT), lanthanum oxide, aluminium oxide, zirconium oxide, titanium oxide, tantalum oxide, yttrium oxide, strontium titanate (STO), barium titanate (BTO), barium zirconate, hafnium zirconate, hafnium-lanthanum oxide, hafnium-silicon oxide, lanthanum-silicon oxide, aluminium-silicon oxide, hafnium-tantalum oxide, hafnium-titanium oxide, or barium strontium titanate (BST).

15. The BDTI structure of claim 10, wherein a dopant of the doped dielectric layer comprises a metal element.

16. The BDTI structure of claim 10, wherein a dopant of the doped dielectric layer comprises Si, Zr, Al, La, Y, Gd or Sr.

17. The BDTI structure of claim 16, wherein a concentration of the dopant with respect to the doped dielectric layer is about 1 to about 99 atomic %.

18. A back-side deep trench isolation (BDTI) structure of a semiconductor device, comprising
a substrate;
a pixel region disposed within the substrate and comprising an image sensing element;
a BDTI structure extending from a first side of the substrate to a position within the substrate, and
a front-side isolation structure extending from a second side of the substrate to a position within the substrate, wherein the second side of the substrate opposites to the first side of the substrate,
wherein the BDTI structure comprises a paraelectric layer, a ferroelectric layer and a cap layer formed between the paraelectric layer and the ferroelectric layer and including metals, metal nitrides or combinations thereof,
wherein the ferroelectric layer vertically and laterally separates the paraelectric layer from the substrate, and
wherein a bottom of the image sensing element is coplanar with a second side of the substrate opposite to the first side of the substrate.

19. The BDTI structure of claim 18, wherein the ferroelectric layer extends over the first side of the substrate.

20. The BDTI structure of claim 18, wherein the paraelectric layer extends over the first side of the substrate.

* * * * *